United States Patent
Morris et al.

(10) Patent No.: US 10,061,719 B2
(45) Date of Patent: Aug. 28, 2018

(54) PACKED WRITE COMPLETIONS

(71) Applicant: Intel Corporation, Santa Clara, CA (US)

(72) Inventors: Brian S. Morris, Santa Clara, CA (US); Jeffrey C. Swanson, Sunnyvale, CA (US); Bill Nale, Livermore, CA (US); Robert G. Blankenship, Tacoma, WA (US); Jeff Willey, Timnath, CO (US); Eric L. Hendrickson, Downey, CA (US)

(73) Assignee: Intel Corporation, Santa Clara, CA (US)

( * ) Notice: Subject to any disclaimer, the term of this patent is extended or adjusted under 35 U.S.C. 154(b) by 35 days.

(21) Appl. No.: 14/583,147

(22) Filed: Dec. 25, 2014

(65) Prior Publication Data

US 2016/0188500 A1 Jun. 30, 2016

(51) Int. Cl.
| | | |
|---|---|---|
| G06F 12/00 | (2006.01) | |
| G06F 13/16 | (2006.01) | |
| G11C 7/10 | (2006.01) | |
| G11C 5/04 | (2006.01) | |

(52) U.S. Cl.
CPC ...... *G06F 13/1663* (2013.01); *G06F 13/1673* (2013.01); *G11C 5/04* (2013.01); *G11C 7/10* (2013.01)

(58) Field of Classification Search
CPC ... G06F 13/1673; G06F 13/1663; G11C 7/10; G11C 5/04
See application file for complete search history.

(56) References Cited

U.S. PATENT DOCUMENTS

| | | | |
|---|---|---|---|
| 8,635,410 B1 * | 1/2014 | Kuskin | G06F 12/0822 711/119 |
| 2005/0080948 A1 * | 4/2005 | Rowlands | G06F 13/4027 710/36 |
| 2005/0120163 A1 * | 6/2005 | Chou | G11C 16/10 711/103 |
| 2006/0112201 A1 | 5/2006 | Hammitt et al. | |
| 2006/0179183 A1 | 8/2006 | Brittain et al. | |
| 2009/0177829 A1 * | 7/2009 | Worthington | G06F 9/4812 710/267 |
| 2010/0250874 A1 | 9/2010 | Farrell et al. | |
| 2011/0153884 A1 | 6/2011 | Shimotaya et al. | |
| 2012/0191802 A1 * | 7/2012 | Rodrigues | H04L 67/06 709/217 |

(Continued)

FOREIGN PATENT DOCUMENTS

WO WO2016-105853 6/2016

OTHER PUBLICATIONS

International Search Report and Written Opinion in International Application No. PCT/US2015/062821 dated Mar. 30, 2016.

(Continued)

*Primary Examiner* — Kalpit Parikh
(74) *Attorney, Agent, or Firm* — Alliance IP, LLC

(57) ABSTRACT

A plurality of completed writes to memory are identified corresponding to a plurality of write requests from a host device received over a buffered memory interface. A completion packet is sent to the host device that includes a plurality of write completions to correspond to the plurality of completed writes.

15 Claims, 23 Drawing Sheets

(56) References Cited

U.S. PATENT DOCUMENTS

| | | | |
|---|---|---|---|
| 2014/0115208 A1* | 4/2014 | Willey | G06F 13/4265 710/105 |
| 2014/0143454 A1* | 5/2014 | Hayut | G06F 3/016 710/19 |
| 2014/0310471 A1 | 10/2014 | Hollaway et al. | |

OTHER PUBLICATIONS

International Preliminary Report on Patentability and Written Opinion in International Application No. PCT/US2015/062821 dated Jun. 27, 2017, 10 pages.

Taiwan Official Letter and Search Report in Taiwan Patent Application No. 104138976 dated Apr. 21, 2017, 15 pages.

Taiwan Patent Office Notice of Allowance in Taiwan Patent Application No. 104138976 dated Jul. 28, 2017, 3 pages including translation.

* cited by examiner

| UI | 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| 0, 1, 2, 3 | 0 | 1 | 2 | 9 | 9 | 12 | 14 | 17 | 19 | 22 | 24 | 27 | 29 | 32 | 34 | 37 | 39 | 42 | 44 | 47 |
| 4, 5, 6, 7 | 1 | 3 | 5 | 7 | 8 | 11 | 13 | 16 | 18 | 21 | 23 | 26 | 28 | 31 | 33 | 36 | 38 | 41 | 43 | 46 |
| 8, 9, 10, 11 | 0 | 2 | 4 | 6 | 12 | 10 | 15 | 17 | 20 | 25 | 25 | 30 | 30 | 35 | 35 | 40 | 40 | 45 | 45 |
| 12, 13, 14, 15 | 2 | 4 | 7 | 9 | 11 | 13 | 15 | 17 | 19 | 22 | 24 | 27 | 29 | 32 | 34 | 37 | 39 | 42 | 44 | 47 |
| 16, 17, 18, 19 | 1 | 3 | 6 | 8 | 10 | 14 | 14 | 19 | 18 | 21 | 23 | 26 | 28 | 31 | 33 | 36 | 38 | 41 | 43 | 46 |
| 20, 21, 22, 23 | 1 | 4 | 6 | 9 | 11 | 13 | 16 | 18 | 21 | 23 | 25 | 27 | 29 | 32 | 34 | 37 | 39 | 42 | 44 | 47 |
| 24, 25, 26, 27 | 0 | 3 | 5 | 8 | 10 | 12 | 15 | 17 | 20 | 22 | 24 | 26 | 28 | 31 | 33 | 36 | 38 | 41 | 43 | 46 |
| 28, 29, 30, 31 | 2 | 4 | 7 | 9 | 12 | 14 | 17 | 19 | 22 | 24 | 27 | 29 | 32 | 34 | 36 | 39 | 40 | 42 | 45 | 45 |
| 32, 33, 34, 35 | 1 | 3 | 6 | 8 | 11 | 13 | 16 | 18 | 21 | 23 | 26 | 28 | 31 | 33 | 35 | 37 | 39 | 41 | 44 | 47 |
| 36, 37, 38, 39 | 0 | 4 | 5 | 7 | 10 | 14 | 15 | 19 | 20 | 24 | 25 | 29 | 30 | 34 | 34 | 39 | 38 | 43 | 43 | 46 |
| 40, 41, 42, 43 | 1 | 3 | 6 | 8 | 11 | 13 | 16 | 18 | 21 | 23 | 26 | 28 | 31 | 33 | 36 | 38 | 41 | 43 | 45 | 47 |
| 44, 45, 46, 47 | 0 | 2 | 5 | 7 | 10 | 12 | 15 | 17 | 20 | 22 | 25 | 27 | 30 | 32 | 35 | 37 | 40 | 42 | 44 | 46 |

| UI | 7 | 6 | 5 | 4 | 3 | 2 | 1 | 0 |
|---|---|---|---|---|---|---|---|---|
| 0, 1, 2, 3 | 47 | 41 | 35 | 29 | 23 | 17 | 11 | 5 |
| 4, 5, 6, 7 | 46 | 40 | 34 | 28 | 22 | 16 | 10 | 4 |
| 8, 9, 10, 11 | 45 | 39 | 33 | 27 | 21 | 15 | 9 | 3 |
| 12, 13, 14, 15 | 44 | 38 | 32 | 26 | 20 | 14 | 8 | 2 |
| 16, 17, 18, 19 | 43 | 37 | 31 | 25 | 19 | 13 | 7 | 1 |
| 20, 21, 22, 23 | 42 | 36 | 30 | 24 | 18 | 12 | 6 | 0 |

|  | L7 | L6 | L5 | L4 | L3 | L2 | L1 | L0 |
|---|---|---|---|---|---|---|---|---|
| UI0 | 191 | 167 | 143 | 119 | 95 | 71 | 47 | 23 |
| UI1 | 190 | 166 | 142 | 118 | 94 | 70 | 46 | 22 |
| UI2 | 189 | 165 | 141 | 117 | 93 | 69 | 45 | 21 |
| UI3 | 188 | 164 | 140 | 116 | 92 | 68 | 44 | 20 |
| UI4 | 187 | 163 | 139 | 115 | 91 | 67 | 43 | 19 |
| UI5 | 186 | 162 | 138 | 114 | 90 | 66 | 42 | 18 |
| UI6 | 185 | 161 | 137 | 113 | 89 | 65 | 41 | 17 |
| UI7 | 184 | 160 | 136 | 112 | 88 | 64 | 40 | 16 |
| UI8 | 183 | 159 | 135 | 111 | 87 | 63 | 39 | 15 |
| UI9 | 182 | 158 | 134 | 110 | 86 | 62 | 38 | 14 |
| UI10 | 181 | 157 | 133 | 109 | 85 | 61 | 37 | 13 |
| UI11 | 180 | 156 | 132 | 108 | 84 | 60 | 36 | 12 |
| UI12 | 179 | 155 | 131 | 107 | 83 | 59 | 35 | 11 |
| UI13 | 178 | 154 | 130 | 106 | 82 | 58 | 34 | 10 |
| UI14 | 177 | 153 | 129 | 105 | 81 | 57 | 33 | 9 |
| UI15 | 176 | 152 | 128 | 104 | 80 | 56 | 32 | 8 |
| UI16 | 175 | 151 | 127 | 103 | 79 | 55 | 31 | 7 |
| UI17 | 174 | 150 | 126 | 102 | 78 | 54 | 30 | 6 |
| UI18 | 173 | 149 | 125 | 101 | 77 | 53 | 29 | 5 |
| UI19 | 172 | 148 | 124 | 100 | 76 | 52 | 28 | 4 |
| UI20 | 171 | 147 | 123 | 99 | 75 | 51 | 27 | 3 |
| UI21 | 170 | 146 | 122 | 98 | 74 | 50 | 26 | 2 |
| UI22 | 169 | 145 | 121 | 97 | 73 | 49 | 25 | 1 |
| UI23 | 168 | 144 | 120 | 96 | 72 | 48 | 24 | 0 |

*FIG. 11*

PACKED WRITE COMPLETIONS

FIELD

The present disclosure relates in general to the field of computing architectures, and more specifically, to buffered memory protocols.

BACKGROUND

Advances in semi-conductor processing and logic design have permitted an increase in the amount of logic that may be present on integrated circuit devices. As a corollary, computer system configurations have evolved from a single or multiple integrated circuits in a system to multiple cores, multiple hardware threads, and multiple logical processors present on individual integrated circuits, as well as other interfaces integrated within such processors. A processor or integrated circuit typically comprises a single physical processor die, where the processor die may include any number of cores, hardware threads, logical processors, interfaces, memory, controller hubs, etc.

As a result of the greater ability to fit more processing power in smaller packages, smaller computing devices have increased in popularity. Smartphones, tablets, ultrathin notebooks, and other user equipment have grown exponentially. However, these smaller devices are reliant on servers both for data storage and complex processing that exceeds the form factor. Consequently, the demand in the high-performance computing market (i.e. server space) has also increased. For instance, in modern servers, there is typically not only a single processor with multiple cores, but also multiple physical processors (also referred to as multiple sockets) to increase the computing power. But as the processing power grows along with the number of devices in a computing system, the communication between sockets and other devices becomes more critical.

In fact, interconnects have grown from more traditional multi-drop buses that primarily handled electrical communications to full blown interconnect architectures that facilitate fast communication. Unfortunately, as the demand for future processors to consume at even higher-rates corresponding demand is placed on the capabilities of existing interconnect architectures.

BRIEF DESCRIPTION OF THE DRAWINGS

FIG. 8 illustrates a representation of an example flit sent over an example twenty-lane data link.

FIG. 9 illustrates a representation of an example flit sent over an example eight-lane data link.

FIG. 11 illustrates a representation of an example flit sent over an example eight-lane data link.

Like reference numbers and designations in the various drawings indicate like elements.

DETAILED DESCRIPTION

Figure 1:
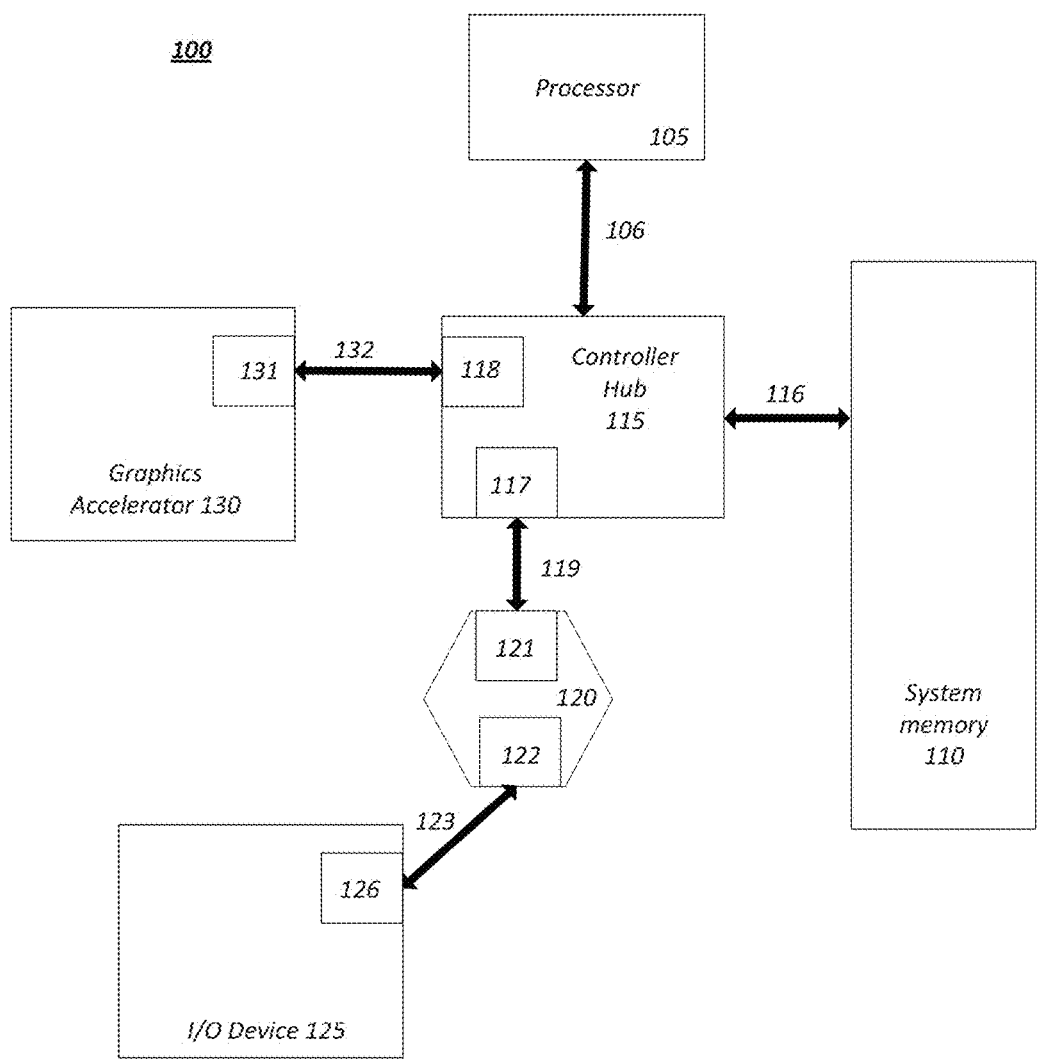
FIG. 1 illustrates a simplified block diagram of a system including a serial point-to-point interconnect to connect I/O devices in a computer system in accordance with one embodiment.

In the following description, numerous specific details are set forth, such as examples of specific types of processors and system configurations, specific hardware structures, specific architectural and micro architectural details, specific register configurations, specific instruction types, specific system components, specific processor pipeline stages, specific interconnect layers, specific packet/transaction configurations, specific transaction names, specific protocol exchanges, specific link widths, specific implementations, and operation etc. in order to provide a thorough understanding of the present invention. It may be apparent, however, to one skilled in the art that these specific details need not necessarily be employed to practice the subject matter of the present disclosure. In other instances, well detailed description of known components or methods has been avoided, such as specific and alternative processor architectures, specific logic circuits/code for described algorithms, specific firmware code, low-level interconnect operation, specific logic configurations, specific manufacturing techniques and materials, specific compiler implementations, specific expression of algorithms in code, specific power down and gating techniques/logic and other specific operational details of computer system in order to avoid unnecessarily obscuring the present disclosure.

Although the following embodiments may be described with reference to energy conservation, energy efficiency, processing efficiency, and so on in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from such features. For example, the disclosed embodiments are not limited to server computer system, desktop computer systems, laptops, Ultrabooks™, but may be also used in other devices, such as handheld devices, smartphones, tablets, other thin notebooks, systems on a chip (SOC) devices, and embedded applications. Some examples of handheld devices include cellular phones, Internet protocol devices, digital cameras, personal digital assistants (PDAs), and handheld PCs. Here, similar techniques for a high-performance interconnect may be applied to increase performance (or even save power) in a low power interconnect. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatus', methods, and systems described herein are not limited to physical computing devices, but may also relate to software optimizations for energy conservation and efficiency. As may become readily apparent in the description below, the embodiments of methods, apparatus', and systems described herein (whether in reference to hardware, firmware, software, or a combination thereof) may be considered vital to a "green technology" future balanced with performance considerations.

As computing systems are advancing, the components therein are becoming more complex. The interconnect architecture to couple and communicate between the components has also increased in complexity to ensure bandwidth demand is met for optimal component operation. Furthermore, different market segments demand different aspects of interconnect architectures to suit the respective market. For example, servers require higher performance, while the mobile ecosystem is sometimes able to sacrifice overall performance for power savings. Yet, it is a singular purpose of most fabrics to provide highest possible performance with maximum power saving. Further, a variety of different interconnects can potentially benefit from subject matter described herein.

The Peripheral Component Interconnect (PCI) Express (PCIe) interconnect fabric architecture and QuickPath Interconnect (QPI) fabric architecture, among other examples, can potentially be improved according to one or more principles described herein, among other examples. For instance, a primary goal of PCIe is to enable components and devices from different vendors to inter-operate in an open architecture, spanning multiple market segments; Clients (Desktops and Mobile), Servers (Standard and Enterprise), and Embedded and Communication devices. PCI Express is a high performance, general purpose I/O interconnect defined for a wide variety of future computing and communication platforms. Some PCI attributes, such as its usage model, load-store architecture, and software interfaces, have been maintained through its revisions, whereas previous parallel bus implementations have been replaced by a highly scalable, fully serial interface. The more recent versions of PCI Express take advantage of advances in point-to-point interconnects, Switch-based technology, and packetized protocol to deliver new levels of performance and features. Power Management, Quality Of Service (QoS), Hot-Plug/Hot-Swap support, Data Integrity, and Error Handling are among some of the advanced features supported by PCI Express. Although the primary discussion herein is in reference to a new high-performance interconnect (HPI) architecture, aspects of the invention described herein may be applied to other interconnect architectures, such as a PCIe-compliant architecture, a QPI-compliant architecture, a MIPI compliant architecture, a high-performance architecture, or other known interconnect architecture.

Referring to FIG. 1, an embodiment of a fabric composed of point-to-point Links that interconnect a set of components is illustrated. System 100 includes processor 105 and system memory 110 coupled to controller hub 115. Processor 105 can include any processing element, such as a microprocessor, a host processor, an embedded processor, a co-processor, or other processor. Processor 105 is coupled to controller hub 115 through front-side bus (FSB) 106. In one embodiment, FSB 106 is a serial point-to-point interconnect as described below. In another embodiment, link 106 includes a serial, differential interconnect architecture that is compliant with different interconnect standard.

System memory 110 includes any memory device, such as random access memory (RAM), non-volatile (NV) memory, or other memory accessible by devices in system 100. System memory 110 is coupled to controller hub 115 through memory interface 116. Examples of a memory interface include a double-data rate (DDR) memory interface, a dual-channel DDR memory interface, and a dynamic RAM (DRAM) memory interface.

In one embodiment, controller hub 115 can include a root hub, root complex, or root controller, such as in a PCIe interconnection hierarchy. Examples of controller hub 115 include a chipset, a memory controller hub (MCH), a northbridge, an interconnect controller hub (ICH) a southbridge, and a root controller/hub. Often the term chipset refers to two physically separate controller hubs, e.g., a memory controller hub (MCH) coupled to an interconnect controller hub (ICH). Note that current systems often include the MCH integrated with processor 105, while controller 115 is to communicate with I/O devices, in a similar manner as described below. In some embodiments, peer-to-peer routing is optionally supported through root complex 115.

Here, controller hub 115 is coupled to switch/bridge 120 through serial link 119. Input/output modules 117 and 121, which may also be referred to as interfaces/ports 117 and 121, can include/implement a layered protocol stack to provide communication between controller hub 115 and switch 120. In one embodiment, multiple devices are capable of being coupled to switch 120.

Switch/bridge 120 routes packets/messages from device 125 upstream, i.e. up a hierarchy towards a root complex, to controller hub 115 and downstream, i.e. down a hierarchy away from a root controller, from processor 105 or system memory 110 to device 125. Switch 120, in one embodiment, is referred to as a logical assembly of multiple virtual PCI-to-PCI bridge devices. Device 125 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Firewire device, a Universal Serial Bus (USB) device, a scanner, and other input/output devices. Often in the PCIe vernacular, such as device, is referred to as an endpoint. Although not specifically shown, device 125 may include a bridge (e.g., a PCIe to PCI/PCI-X bridge) to support legacy or other versions of devices or interconnect fabrics supported by such devices.

Graphics accelerator 130 can also be coupled to controller hub 115 through serial link 132. In one embodiment, graphics accelerator 130 is coupled to an MCH, which is coupled to an ICH. Switch 120, and accordingly I/O device 125, is then coupled to the ICH. I/O modules 131 and 118 are also to implement a layered protocol stack to communicate between graphics accelerator 130 and controller hub 115. Similar to the MCH discussion above, a graphics controller or the graphics accelerator 130 itself may be integrated in processor 105.

Figure 2:
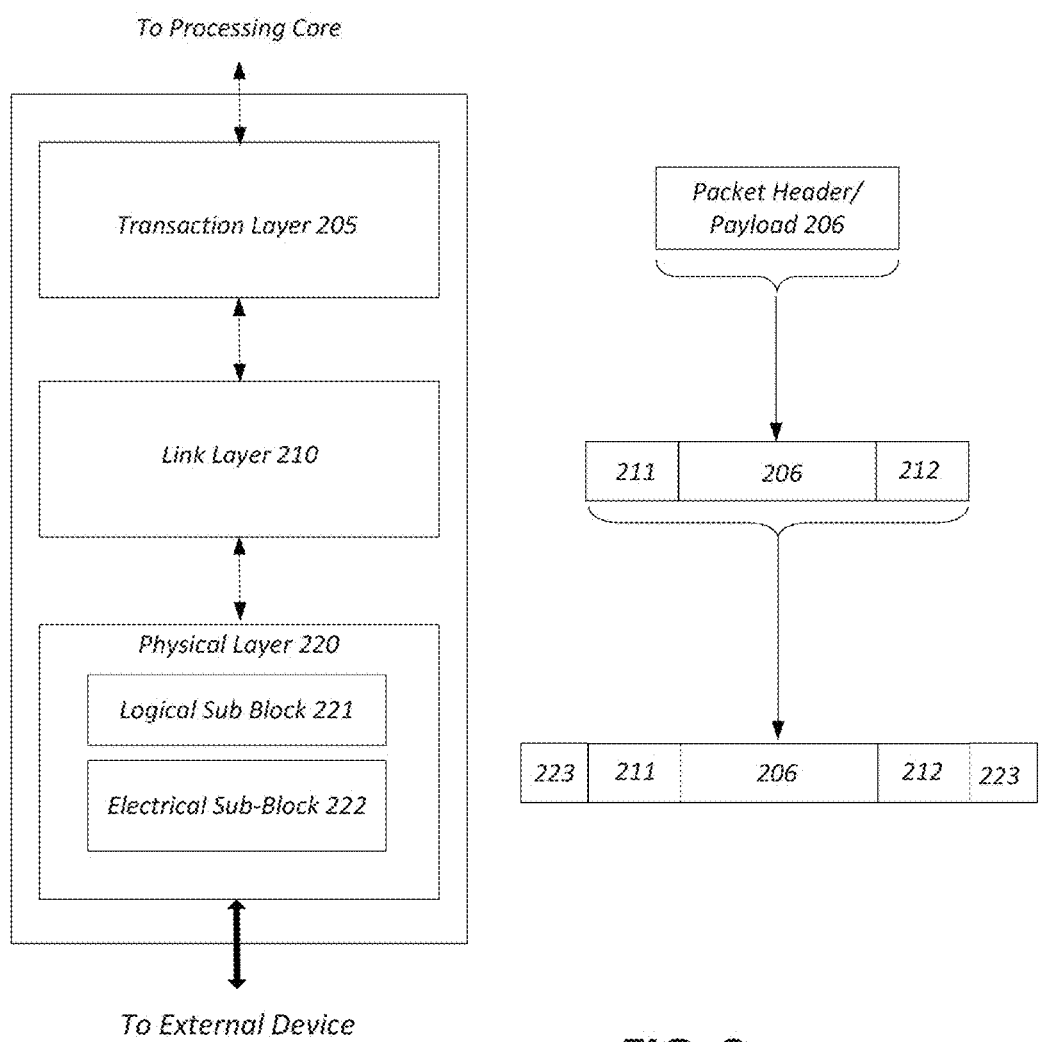
FIG. 2 illustrates a simplified block diagram of a layered protocol stack in accordance with one embodiment.

Turning to FIG. 2 an embodiment of a layered protocol stack is illustrated. Layered protocol stack 200 can includes any form of a layered communication stack, such as a QPI stack, a PCIe stack, a next generation high performance computing interconnect (HPI) stack, or other layered stack. In one embodiment, protocol stack 200 can include transaction layer 205, link layer 210, and physical layer 220. An interface, such as interfaces 117, 118, 121, 122, 126, and 131 in FIG. 1, may be represented as communication protocol stack 200. Representation as a communication protocol stack may also be referred to as a module or interface implementing/including a protocol stack.

Packets can be used to communicate information between components. Packets can be formed in the Transaction Layer 205 and Data Link Layer 210 to carry the information from the transmitting component to the receiving component. As the transmitted packets flow through the other layers, they are extended with additional information used to handle packets at those layers. At the receiving side the reverse process occurs and packets get transformed from their Physical Layer 220 representation to the Data Link Layer 210 representation and finally (for Transaction Layer Packets) to the form that can be processed by the Transaction Layer 205 of the receiving device.

In one embodiment, transaction layer 205 can provide an interface between a device's processing core and the interconnect architecture, such as Data Link Layer 210 and Physical Layer 220. In this regard, a primary responsibility of the transaction layer 205 can include the assembly and disassembly of packets (i.e., transaction layer packets, or TLPs). The translation layer 205 can also manage credit-based flow control for TLPs. In some implementations, split transactions can be utilized, i.e., transactions with request and response separated by time, allowing a link to carry other traffic while the target device gathers data for the response, among other examples.

Credit-based flow control can be used to realize virtual channels and networks utilizing the interconnect fabric. In one example, a device can advertise an initial amount of credits for each of the receive buffers in Transaction Layer 205. An external device at the opposite end of the link, such as controller hub 115 in FIG. 1, can count the number of credits consumed by each TLP. A transaction may be transmitted if the transaction does not exceed a credit limit. Upon receiving a response an amount of credit is restored. One example of an advantage of such a credit scheme is that the latency of credit return does not affect performance, provided that the credit limit is not encountered, among other potential advantages.

In one embodiment, four transaction address spaces can include a configuration address space, a memory address space, an input/output address space, and a message address space. Memory space transactions include one or more of read requests and write requests to transfer data to/from a memory-mapped location. In one embodiment, memory space transactions are capable of using two different address formats, e.g., a short address format, such as a 32-bit address, or a long address format, such as 64-bit address. Configuration space transactions can be used to access configuration space of various devices connected to the interconnect. Transactions to the configuration space can include read requests and write requests. Message space transactions (or, simply messages) can also be defined to support in-band communication between interconnect agents. Therefore, in one example embodiment, transaction layer 205 can assemble packet header/payload 206.

Figure 3:
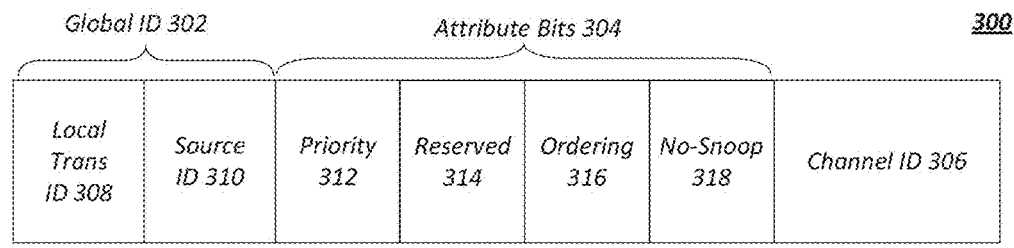
FIG. 3 illustrates an embodiment of a transaction descriptor.

Quickly referring to FIG. 3, an example embodiment of a transaction layer packet descriptor is illustrated. In one embodiment, transaction descriptor 300 can be a mechanism for carrying transaction information. In this regard, transaction descriptor 300 supports identification of transactions in a system. Other potential uses include tracking modifications of default transaction ordering and association of transaction with channels. For instance, transaction descriptor 300 can include global identifier field 302, attributes field 304 and channel identifier field 306. In the illustrated example, global identifier field 302 is depicted comprising local transaction identifier field 308 and source identifier field 310. In one embodiment, global transaction identifier 302 is unique for all outstanding requests.

According to one implementation, local transaction identifier field 308 is a field generated by a requesting agent, and can be unique for all outstanding requests that require a completion for that requesting agent. Furthermore, in this example, source identifier 310 uniquely identifies the requestor agent within an interconnect hierarchy. Accordingly, together with source ID 310, local transaction identifier 308 field provides global identification of a transaction within a hierarchy domain.

Attributes field 304 specifies characteristics and relationships of the transaction. In this regard, attributes field 304 is potentially used to provide additional information that allows modification of the default handling of transactions. In one embodiment, attributes field 304 includes priority field 312, reserved field 314, ordering field 316, and no-snoop field 318. Here, priority sub-field 312 may be modified by an initiator to assign a priority to the transaction. Reserved attribute field 314 is left reserved for future, or vendor-defined usage. Possible usage models using priority or security attributes may be implemented using the reserved attribute field.

In this example, ordering attribute field 316 is used to supply optional information conveying the type of ordering that may modify default ordering rules. According to one example implementation, an ordering attribute of "0" denotes default ordering rules are to apply, wherein an ordering attribute of "1" denotes relaxed ordering, wherein writes can pass writes in the same direction, and read completions can pass writes in the same direction. Snoop attribute field 318 is utilized to determine if transactions are snooped. As shown, channel ID Field 306 identifies a channel that a transaction is associated with.

Returning to the discussion of FIG. 2, a Link layer 210, also referred to as data link layer 210, can act as an intermediate stage between transaction layer 205 and the physical layer 220. In one embodiment, a responsibility of the data link layer 210 is providing a reliable mechanism for exchanging Transaction Layer Packets (TLPs) between two components on a link. One side of the Data Link Layer 210 accepts TLPs assembled by the Transaction Layer 205, applies packet sequence identifier 211, i.e. an identification number or packet number, calculates and applies an error detection code, i.e. CRC 212, and submits the modified TLPs to the Physical Layer 220 for transmission across a physical to an external device.

In one example, physical layer 220 includes logical sub block 221 and electrical sub-block 222 to physically transmit a packet to an external device. Here, logical sub-block 221 is responsible for the "digital" functions of Physical Layer 221. In this regard, the logical sub-block can include a transmit section to prepare outgoing information for transmission by physical sub-block 222, and a receiver section to identify and prepare received information before passing it to the Link Layer 210.

Physical block 222 includes a transmitter and a receiver. The transmitter is supplied by logical sub-block 221 with symbols, which the transmitter serializes and transmits onto to an external device. The receiver is supplied with serialized symbols from an external device and transforms the received signals into a bit-stream. The bit-stream is de-serialized and supplied to logical sub-block 221. In one example embodiment, an 8b/10b transmission code is employed, where ten-bit symbols are transmitted/received. Here, special symbols are used to frame a packet with frames 223. In addition, in one example, the receiver also provides a symbol clock recovered from the incoming serial stream.

As stated above, although transaction layer 205, link layer 210, and physical layer 220 are discussed in reference to a specific embodiment of a protocol stack (such as a PCIe protocol stack), a layered protocol stack is not so limited. In fact, any layered protocol may be included/implemented and adopt features discussed herein. As an example, a port/interface that is represented as a layered protocol can include: (1) a first layer to assemble packets, i.e. a transaction layer; a second layer to sequence packets, i.e. a link layer; and a third layer to transmit the packets, i.e. a physical layer. As a specific example, a high performance interconnect layered protocol, as described herein, is utilized.

Figure 4:
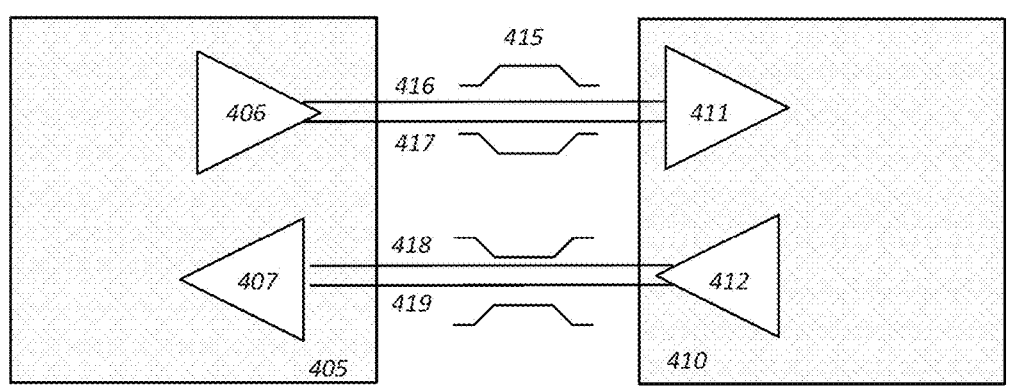
FIG. 4 illustrates an embodiment of a serial point-to-point link.

Referring next to FIG. 4, an example embodiment of a serial point to point fabric is illustrated. A serial point-to-point link can include any transmission path for transmitting serial data. In the embodiment shown, a link can include two, low-voltage, differentially driven signal pairs: a transmit pair 406/411 and a receive pair 412/407. Accordingly, device 405 includes transmission logic 406 to transmit data to device 410 and receiving logic 407 to receive data from device 410. In other words, two transmitting paths, i.e. paths 416 and 417, and two receiving paths, i.e. paths 418 and 419, are included in some implementations of a link.

A transmission path refers to any path for transmitting data, such as a transmission line, a copper line, an optical line, a wireless communication channel, an infrared communication link, or other communication path. A connection between two devices, such as device 405 and device 410, is referred to as a link, such as link 415. A link may support one lane—each lane representing a set of differential signal pairs (one pair for transmission, one pair for reception). To scale bandwidth, a link may aggregate multiple lanes denoted by xN, where N is any supported link width, such as 1, 2, 4, 8, 12, 16, 32, 64, or wider.

A differential pair can refer to two transmission paths, such as lines 416 and 417, to transmit differential signals. As an example, when line 416 toggles from a low voltage level to a high voltage level, i.e. a rising edge, line 417 drives from a high logic level to a low logic level, i.e. a falling edge. Differential signals potentially demonstrate better electrical characteristics, such as better signal integrity, i.e. cross-coupling, voltage overshoot/undershoot, ringing, among other example advantages. This allows for a better timing window, which enables faster transmission frequencies.

In one embodiment, a new High Performance Interconnect (HPI) is provided. HPI can include a next-generation cache-coherent, link-based interconnect. As one example, HPI may be utilized in high performance computing platforms, such as workstations or servers, including in systems where PCIe or another interconnect protocol is typically used to connect processors, accelerators, I/O devices, and the like. However, HPI is not so limited. Instead, HPI may be utilized in any of the systems or platforms described herein. Furthermore, the individual ideas developed may be applied to other interconnects and platforms, such as PCIe, MIPI, QPI, etc.

Figure 5:
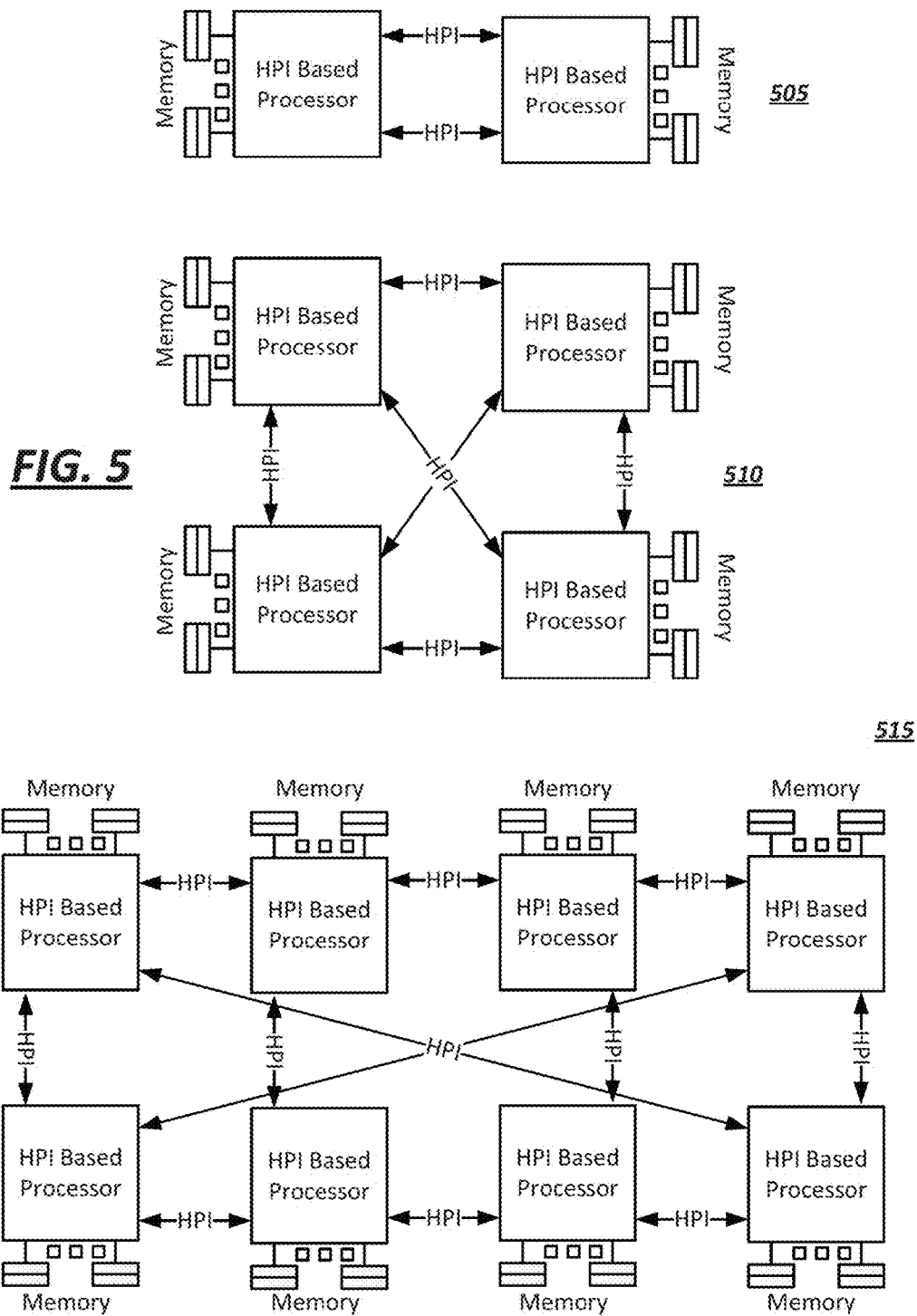
FIG. 5 illustrates embodiments of potential High Performance Interconnect (HPI) system configurations.

To support multiple devices, in one example implementation, HPI can include an Instruction Set Architecture (ISA) agnostic (i.e. HPI is able to be implemented in multiple different devices). In another scenario, HPI may also be utilized to connect high performance I/O devices, not just processors or accelerators. For example, a high performance PCIe device may be coupled to HPI through an appropriate translation bridge (i.e. HPI to PCIe). Moreover, the HPI links may be utilized by many HPI based devices, such as processors, in various ways (e.g. stars, rings, meshes, etc.). FIG. 5 illustrates example implementations of multiple potential multi-socket configurations. A two-socket configuration 505, as depicted, can include two HPI links; however, in other implementations, one HPI link may be utilized. For larger topologies, any configuration may be utilized as long as an identifier (ID) is assignable and there is some form of virtual path, among other additional or substitute features. As shown, in one example, a four socket configuration 510 has an HPI link from each processor to another. But in the eight socket implementation shown in configuration 515, not every socket is directly connected to each other through an HPI link. However, if a virtual path or channel exists between the processors, the configuration is supported. A range of supported processors includes 2-32 in a native domain. Higher numbers of processors may be reached through use of multiple domains or other interconnects between node controllers, among other examples.

The HPI architecture includes a definition of a layered protocol architecture, including in some examples, protocol layers (coherent, non-coherent, and, optionally, other memory based protocols), a routing layer, a link layer, and a physical layer. Furthermore, HPI can further include enhancements related to power managers (such as power control units (PCUs)), design for test and debug (DFT), fault handling, registers, security, among other examples. FIG. 5 illustrates an embodiment of an example HPI layered protocol stack. In some implementations, at least some of the layers illustrated in FIG. 5 may be optional. Each layer deals with its own level of granularity or quantum of information (the protocol layer 605*a,b* with packets 630, link layer 610*a,b* with flits 635, and physical layer 605*a,b* with phits 640). Note that a packet, in some embodiments, may include partial flits, a single flit, or multiple flits based on the implementation.

As a first example, a width of a phit 640 includes a 1 to 1 mapping of link width to bits (e.g. 20 bit link width includes a phit of 20 bits, etc.). Flits may have a greater size, such as 184, 192, or 200 bits. Note that if phit 640 is 20 bits wide and the size of flit 635 is 184 bits then it takes a fractional number of phits 640 to transmit one flit 635 (e.g. 9.2 phits at 20 bits to transmit an 184 bit flit 635 or 9.6 at 20 bits to transmit a 192 bit flit, among other examples). Note that widths of the fundamental link at the physical layer may vary. For example, the number of lanes per direction may include 2, 4, 6, 8, 10, 12, 14, 16, 18, 20, 22, 24, etc. In one embodiment, link layer 610*a,b* is capable of embedding multiple pieces of different transactions in a single flit, and one or multiple headers (e.g. 1, 2, 3, 4) may be embedded within the flit. In one example, HPI splits the headers into corresponding slots to enable multiple messages in the flit destined for different nodes.

Physical layer 605a,b, in one embodiment, can be responsible for the fast transfer of information on the physical medium (electrical or optical etc.). The physical link can be point-to-point between two Link layer entities, such as layer 605a and 605b. The Link layer 610a,b can abstract the Physical layer 605a,b from the upper layers and provides the capability to reliably transfer data (as well as requests) and manage flow control between two directly connected entities. The Link Layer can also be responsible for virtualizing the physical channel into multiple virtual channels and message classes. The Protocol layer 620a,b relies on the Link layer 610a,b to map protocol messages into the appropriate message classes and virtual channels before handing them to the Physical layer 605a,b for transfer across the physical links. Link layer 610a,b may support multiple messages, such as a request, snoop, response, writeback, non-coherent data, among other examples.

Figure 6:
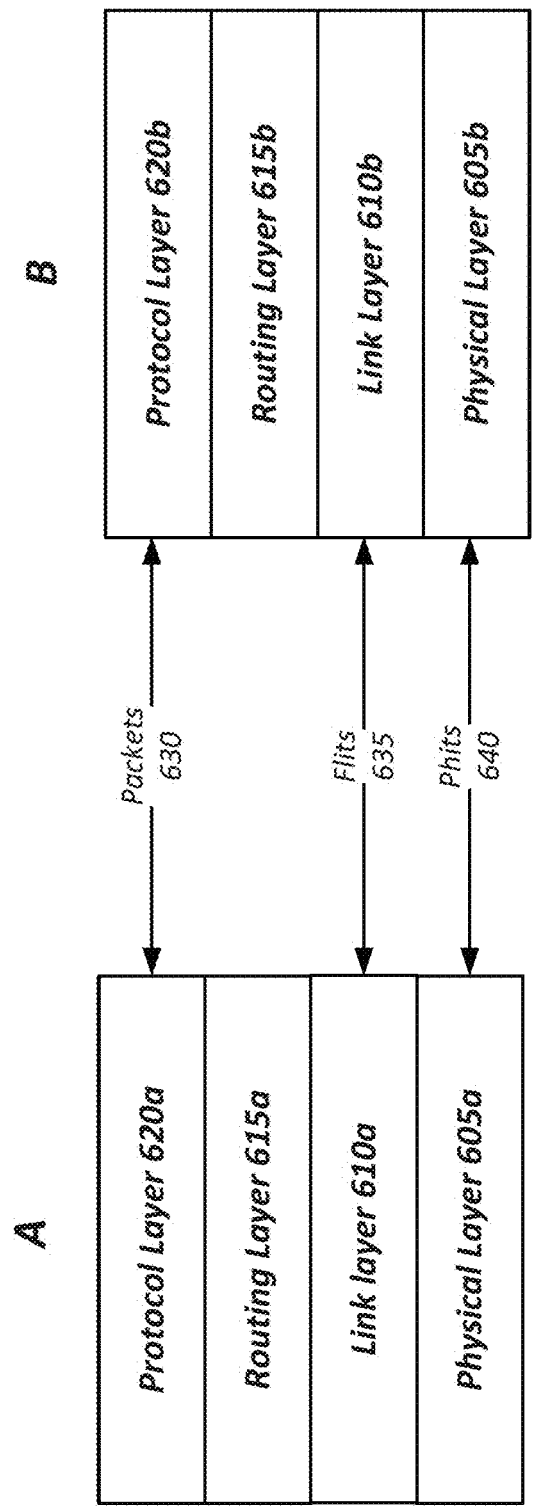
FIG. 6 illustrates an embodiment of a layered protocol stack associated with HPI.

The Physical layer 605a,b (or PHY) of HPI can be implemented above the electrical layer (i.e. electrical conductors connecting two components) and below the link layer 610a,b, as illustrated in FIG. 6. The Physical layer and corresponding logic can reside on each agent and connects the link layers on two agents (A and B) separated from each other (e.g. on devices on either side of a link). The local and remote electrical layers are connected by physical media (e.g. wires, conductors, optical, etc.). The Physical layer 605a,b, in one embodiment, has two major phases, initialization and operation. During initialization, the connection is opaque to the link layer and signaling may involve a combination of timed states and handshake events. During operation, the connection is transparent to the link layer and signaling is at a speed, with all lanes operating together as a single link. During the operation phase, the Physical layer transports flits from agent A to agent B and from agent B to agent A. The connection is also referred to as a link and abstracts some physical aspects including media, width and speed from the link layers while exchanging flits and control/status of current configuration (e.g. width) with the link layer. The initialization phase includes minor phases e.g. Polling, Configuration. The operation phase also includes minor phases (e.g. link power management states).

In one embodiment, Link layer 610a,b can be implemented so as to provide reliable data transfer between two protocol or routing entities. The Link layer can abstract Physical layer 605a,b from the Protocol layer 620a,b, and can be responsible for the flow control between two protocol agents (A, B), and provide virtual channel services to the Protocol layer (Message Classes) and Routing layer (Virtual Networks). The interface between the Protocol layer 620a,b and the Link Layer 610a,b can typically be at the packet level. In one embodiment, the smallest transfer unit at the Link Layer is referred to as a flit which a specified number of bits, such as 192 bits or some other denomination. The Link Layer 610a,b relies on the Physical layer 605a,b to frame the Physical layer's 605a,b unit of transfer (phit) into the Link Layer's 610a,b unit of transfer (flit). In addition, the Link Layer 610a,b may be logically broken into two parts, a sender and a receiver. A sender/receiver pair on one entity may be connected to a receiver/sender pair on another entity. Flow Control is often performed on both a flit and a packet basis. Error detection and correction is also potentially performed on a flit level basis.

In one embodiment, Routing layer 615a,b can provide a flexible and distributed method to route HPI transactions from a source to a destination. The scheme is flexible since routing algorithms for multiple topologies may be specified through programmable routing tables at each router (the programming in one embodiment is performed by firmware, software, or a combination thereof). The routing functionality may be distributed; the routing may be done through a series of routing steps, with each routing step being defined through a lookup of a table at either the source, intermediate, or destination routers. The lookup at a source may be used to inject a HPI packet into the HPI fabric. The lookup at an intermediate router may be used to route an HPI packet from an input port to an output port. The lookup at a destination port may be used to target the destination HPI protocol agent. Note that the Routing layer, in some implementations, can be thin since the routing tables, and, hence the routing algorithms, are not specifically defined by specification. This allows for flexibility and a variety of usage models, including flexible platform architectural topologies to be defined by the system implementation. The Routing layer 615a,b relies on the Link layer 610a,b for providing the use of up to three (or more) virtual networks (VNs)—in one example, two deadlock-free VNs, VN0 and VN1 with several message classes defined in each virtual network. A shared adaptive virtual network (VNA) may be defined in the Link layer, but this adaptive network may not be exposed directly in routing concepts, since each message class and virtual network may have dedicated resources and guaranteed forward progress, among other features and examples.

In one embodiment, HPI can include a Coherence Protocol layer 620a,b to support agents caching lines of data from memory. An agent wishing to cache memory data may use the coherence protocol to read the line of data to load into its cache. An agent wishing to modify a line of data in its cache may use the coherence protocol to acquire ownership of the line before modifying the data. After modifying a line, an agent may follow protocol requirements of keeping it in its cache until it either writes the line back to memory or includes the line in a response to an external request. Lastly, an agent may fulfill external requests to invalidate a line in its cache. The protocol ensures coherency of the data by dictating the rules all caching agents may follow. It also provides the means for agents without caches to coherently read and write memory data.

Two conditions may be enforced to support transactions utilizing the HPI Coherence Protocol. First, the protocol can maintain data consistency, as an example, on a per-address basis, among data in agents' caches and between those data and the data in memory. Informally, data consistency may refer to each valid line of data in an agent's cache representing a most up-to-date value of the data and data transmitted in a coherence protocol packet can represent the most up-to-date value of the data at the time it was sent. When no valid copy of the data exists in caches or in transmission, the protocol may ensure the most up-to-date value of the data resides in memory. Second, the protocol can provide well-defined commitment points for requests. Commitment points for reads may indicate when the data is usable; and for writes they may indicate when the written data is globally observable and will be loaded by subsequent reads. The protocol may support these commitment points for both cacheable and uncacheable (UC) requests in the coherent memory space.

In some implementations, HPI can utilize an embedded clock. A clock signal can be embedded in data transmitted using the interconnect. With the clock signal embedded in the data, distinct and dedicated clock lanes can be omitted. This can be useful, for instance, as it can allow more pins of a device to be dedicated to data transfer, particularly in systems where space for pins is at a premium.

A link can be established between two agents on either side of an interconnect. An agent sending data can be a local agent and the agent receiving the data can be a remote agent. State machines can be employed by both agents to manage various aspects of the link. In one embodiment, the Physical layer data path can transmit flits from the link layer to the electrical front-end. The control path, in one implementation, includes a state machine (also referred to as a link training state machine or the similar). The state machine's actions and exits from states may depend on internal signals, timers, external signals or other information. In fact, some of the states, such as a few initialization states, may have timers to provide a timeout value to exit a state. Note that detect, in some embodiments, refers to detecting an event on both legs of a lane; but not necessarily simultaneously. However, in other embodiments, detect refers to detection of an event by an agent of reference. Debounce, as one example, refers to sustained assertion of a signal. In one embodiment, HPI supports operation in the event of non-function lanes. Here, lanes may be dropped at specific states.

States defined in the state machine can include reset states, initialization states, and operational states, among other categories and subcategories. In one example, some initialization states can have a secondary timer which is used to exit the state on a timeout (essentially an abort due to failure to make progress in the state). An abort may include updating of registers, such as status register. Some states can also have primary timer(s) which are used to time the primary functions in the state. Other states can be defined such that internal or external signals (such as handshake protocols) drive transition from the state to another state, among other examples.

A state machine may also support debug through single step, freeze on initialization abort and use of testers. Here, state exits can be postponed/held until the debug software is ready. In some instance, the exit can be postponed/held until the secondary timeout. Actions and exits, in one embodiment, can be based on exchange of training sequences. In one embodiment, the link state machine is to run in the local agent clock domain and transition from one state to the next is to coincide with a transmitter training sequence boundary. Status registers may be utilized to reflect the current state.

Figure 7:
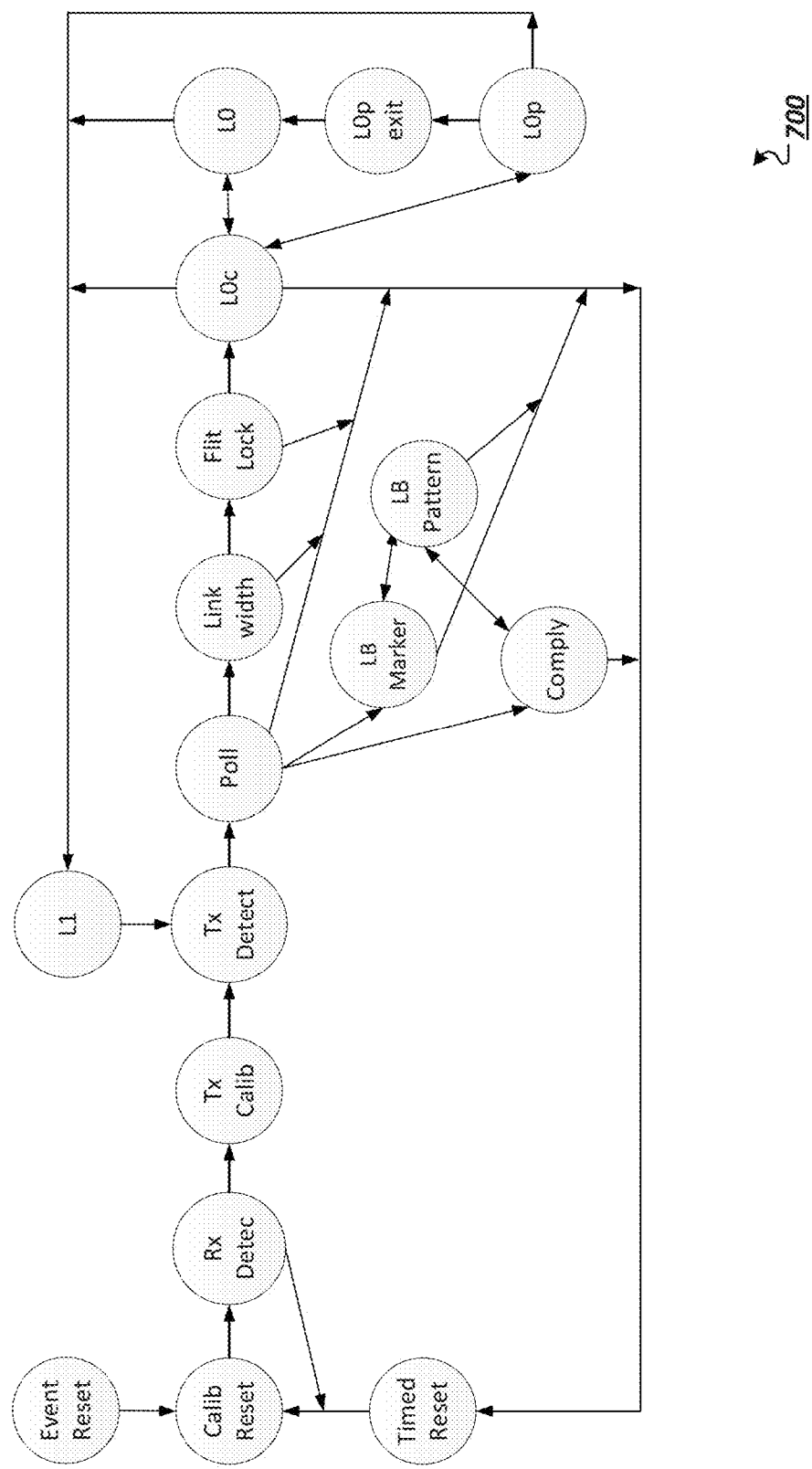
FIG. 7 illustrates a representation of an example state machine.

FIG. 7 illustrates a representation of at least a portion of a state machine used by agents in one example implementation of HPI. It should be appreciated that the states included in the state table of FIG. 7 include a non-exhaustive listing of possible states. For instance, some transitions are omitted to simplify the diagram. Also, some states may be combined, split, or omitted, while others might be added. Such states can include:

Event reset state: entered on a warm or cold reset event. Restores default values. Initialize counters (e.g., sync counters). May exit to another state, such as another reset state.

Timed reset state: timed state for in-band reset. May drive a predefined electrical ordered set (EOS) so remote receivers are capable of detecting the EOS and entering the timed reset as well. Receiver has lanes holding electrical settings. May exit to an agent to calibrate reset state.

Calibrate reset state: calibration without signaling on the lane (e.g. receiver calibration state) or turning drivers off. May be a predetermined amount of time in the state based on a timer. May set an operational speed. May act as a wait state when a port is not enabled. May include minimum residency time. Receiver conditioning or staggering off may occur based on design. May exit to a receiver detect state after a timeout and/or completion of calibration.

Receiver detect state: detect presence of a receiver on lane(s). May look for receiver termination (e.g. receiver pulldown insertion). May exit to calibrate reset state upon a specified value being set or when another specified value is not set. May exit to transmitter calibrate state if a receiver is detected or a timeout is reached.

Transmitter calibrate state: for transmitter calibrations. May be a timed state allocated for transmitter calibrations. May include signaling on a lane. May continuously drive an EOS, such as an electric idle exit ordered set (or EIEIOS). May exit to compliance state when done calibrating or on expiration of a timer. May exit to transmitter detect state if a counter has expired or a secondary timeout has occurred.

Transmitter detect state: qualifies valid signaling. May be a handshake state where an agent completes actions and exits to a next state based on remote agent signaling. Receiver may qualify valid signaling from transmitter. Receiver, in one embodiment, looks for a wake detect, and if debounced on one or more lanes looks for it on the other lanes. Transmitter drives a detect signal. May exit to a polling state in response to debounce being completed for all lanes and/or a timeout or if debounce on all lanes is not complete and there is a timeout. Here, one or more monitor lanes may be kept awake to debounce a wake signal. And if debounced then the other lanes are potentially debounced. This can enable power savings in low power states.

Polling state: receiver adapts, locks on bits (e.g., by initializing a drift buffer), locks on bytes (e.g., by identifying symbol boundaries), and locks on training sequence boundaries (e.g., by locking to an electrical ordered set (EOS) and/or a training sequence header). Lanes may then be deskewed. Handshakes can also be completed to exit polling to one of several potential states. For instance, an exit can be caused (by an agent) to any one of a Link Width state, Compliance state, Loopback Marker state, or Reset state. Handshaking can include the completion of various defined receiver actions or conditions and the sending of an acknowledge message (ACK) to trigger the exit to the state corresponding to the completed set of actions and the ACK. For polling deskew, lane to lane skew at remote transmitter may be capped at a first length for top speed and a second length for slow speed. Deskew may be performed in a slow mode as well as an operational mode. Receiver may have a specific maximum to deskew lane-to-lane skew, such as 8, 16, or 32 intervals of skew. Receiver actions may also include latency fixing in some implementations. Receiver actions, in one embodiment, can be completed on successful deskew of a valid lane map. A successful handshake can be achieved, in one example, when a number of consecutive training sequence headers are received with acknowledgements and a number of training sequences with an acknowledge are transmitted after the receiver has completed its actions.

Compliance state: entered from the Polling state. An agent may be made a Compliance master or slave for validation purposes. The device (acting as master) can send a compliance pattern to another device (slave) and the slave can loop back the pattern after re-timing it to its local clock (e.g., without undo of any polarity inversion or lane reversal). The compliance pattern can be used to characterize operation of the analog front end on some subset of lanes when Loopback is not functional or undesired. For instance, entering Loopback can be preconditioned on successful byte lock, TS lock, deskew, latency testing, and other testing reliant on the proper functioning of several piece of digital logic. With bit lock accomplished, Compliance can be entered and may be utilized for jitter or noise investigation, debug, exploring a link, among other conditioning. In other words, Compliance can serve as an alternative exit for Polling in the event the results of Polling do not allow direct entry into Loopback. The Compliance state can drive a supersequence with a transmitter from the master. Receiver looks for a wake on a monitor lane, debounces the wake, drops bad lanes, adapts, and bit locks, etc. The slave transmitter can drive the compliance pattern until its receiver actions are complete. Then loop-back is re-timed and non-deskewed. Slave receiver does similar monitor and debounce, etc. actions. Exit may be to a reset state, such as a timed reset, or to a Loopback Pattern state to start the test, among other examples. In the case of an exit to Loopback Pattern state, the master may be sent (e.g., by a software controller) to the Loopback Pattern state to try out more specialized patterns.

Agent Loopback Marker State: Loopback marker is an agent state but unlike other agent states master and slave actions and exits may be different. Loopback slave may undo any polarity inversion and/or lane reversal but may not descramble or rescramble looped back bits. Acknowledgment exchange may not apply to slave since it is looping back. Since slave may deskew before looping back on symbol boundary, master may not be forced to re-bytelock or re-deskew but the master may re-lock training sequence to avoid locking to some alias. Means to do this may include re-seeding of LFSR, comparing TS and/or EIEOS or some combination of these. The end of the SDS marks the end of loopback setup and the start of pattern generation, checking and counting.

Agent Loopback Pattern State (or Block Link state): Entered from either a Loopback Marker state or Compliance state. In Loopback Pattern state, instead of control patterns, a master transmitter can send additional specialized patterns to supplement those looped-back in a Compliance or Loopback Pattern state. The receiver can receive specialized patterns in Loopback Pattern and check for errors in the received pattern. For transmitter adaptation both agents can be masters. For a predetermined period, the transmitter can sends a pattern and a remote receiver can compare this pattern and determine a figure of merit or metric for the received pattern which is recorded in a storage element, such as a register. The comparison method and metric may be design dependent (e.g., BER with jitter injection). At the end of the period, both agents can exit to Reset for the backchannel to examine the metric and set up the next iteration of transmitter adaptation.

Link width state: agent communicates with the final lane map to remote transmitter. Receiver receives the information and decodes. Receiver may record a configured lane map in a structure after checkpoint of a previous lane map value in a second structure. Receiver may also respond with an acknowledge ("ACK"). May initiate an in-band reset. As one example, first state to initiate in-band reset. In one embodiment, exit to a next state, such as flit configuration state, is performed in response to the ACK. Further, prior to entering low power state, a reset signal may also be generated if the frequency of a wake detect signal occurrence drops below a specified value (e.g. 1 every number of unit intervals (UIs), such as 4K UI). Receiver may hold current and previous lane maps. Transmitter may use different groups of lanes based on training sequences having different values. Lane map may not modify some status registers in some embodiments.

Flitlock configuration state: entered by a transmitter but the state is considered exited (i.e. secondary timeout moot) when both transmitter and receiver have exited to a blocking link state or other link state. Transmitter exit to a link state, in one embodiment, includes start of a data sequence (SDS) and training sequence (TS) boundary after receiving a planetary alignment signal. Here, receiver exit may be based on receiving an SDS from a remote transmitter. This state may be a bridge from agent to link state. Receiver identifies SDS. Receiver may exit to blocking link state (BLS) (or a control window) if SDS received after a descrambler is initialized. If a timeout occurs, exit may be to reset state. Transmitter drives lanes with a configuration signal. Transmitter exit may be to reset, BLS, or other states based on conditions or timeouts.

Transmitting Link State: a link state. Flits are sent to a remote agent. May be entered from a blocking link state and return to a blocking link state on an event, such as a timeout. Transmitter transmits flits. Receiver receives flits. May also exit to a low power link state. In some implementations, transmitting link state (TLS) can be referred to as the L0 state.

Blocking Link State: a link state. Transmitter and receiver are operating in a unified manner. May be a timed state during which the link layer flits are held off while the Physical layer information is communicated to the remote agent. May exit to a low power link state (or other link state based on the design). A blocking link state (BLS), in one embodiment, periodically occurs. The period is referred to as a BLS interval and may be timed, as well as may differ between slow speed and operational speed. Note that the link layer may be periodically blocked from sending flits so that a Physical layer control sequence of a length may be sent, such as during a transmitting link state or a partial width transmitting link state. In some implementations, blocking link state (BLS) can be referred to as a L0 control, or L0c, state.

Partial Width Transmitting Link State: Link state. May save power by entering a partial width state. In one embodiment asymmetric partial width refers to each direction of a two direction link having different widths, which may be supported in some designs. An example of an initiator, such as a transmitter, sending a partial width indication to enter partial width transmitting link state is shown in the example of FIG. 9. Here, a partial width indication is sent while transmitting on a link with a first width to transition the link to transmit at a second, new width. A mismatch may result in a reset. Note that speeds may not be altered but width may be. Therefore, flits are potentially sent at different widths. May be similar to a transmitting link state logically; yet, since there is a smaller width, it may take longer to transmit flits. May exit to other link states, such as a low power link state based on certain received and sent messages or an exit of the partial width transmitting link state or a link blocking state based on other events. In one embodiment, a transmitter port may turn idle lanes off in a staggered manner to provide better signal integrity (i.e. noise mitigation) as shown in the timing diagram. Here, non-retry-able flits, such as Null flits, may be utilized during periods where the link width is changing. A corresponding receiver may drop these null flits and turn idle lanes off in a staggered manner, as well as record the current and previous lane maps in one or more structures. Note status and associated status register may remain unaltered. In some implementations, partial width transmitting link state can be referred to as a partial L0, or L0p, state.

Exit Partial Width Transmitting Link State: exit the partial width state. May or may not use a blocking link state in some implementations. The transmitter initiates exit, in one embodiment, by sending partial width exit patterns on the idle lanes to train and deskew them. As one example, an exit pattern start with EIEOS, which is detected and debounced to signal that the lane is ready to start the entry to a full transmitting link state, and may end with SDS or Fast Training Sequence (FTS) on idle lanes. Any failure during the exit sequence (receiver actions, such as deskew not completed prior to timeout) stops flit transfers to the link layer and asserts a reset, which is handled by resetting the link on the next blocking link state occurrence. The SDS may also initialize the scrambler/descrambler on the lanes to appropriate values.

Low Power Link State: is a lower power state. In one embodiment, it is lower power than the partial width link state, since signaling in this embodiment is stopped on all lanes and in both directions. Transmitters may use a blocking link state for requesting a low power link state. Here, receiver may decode the request and respond with an ACK or a NAK; otherwise reset may be triggered. In some implementations, low power link state can be referred to as a L1 state.

In some implementations, state transitions can be facilitated to allow states to be bypassed, for instance, when state actions of the states, such as certain calibrations and configurations, have already been completed. Previous state results and configurations of a link can be stored and reused in subsequent initializations and configurations of a link. Rather than repeating such configurations and state actions, corresponding states can be bypassed. Traditional systems implementing state bypasses, however, often implement complex designs and expensive validation escapes. Rather than using a traditional bypass, in one example, HPI can utilize short timers in certain states, such as where the state actions do not need to be repeated. This can potentially allow for more uniform and synchronized state machine transitions among other potential advantages.

In one example, a software-based controller (e.g., through an external control point for the Physical layer) can enable a short timer for one or more particular states. For instance, for a state for which actions have already been performed and stored, the state can be short-timed to facilitate a quick exit from the state to a next state. If, however, the previous state action fails or cannot be applied within the short timer duration, a state exit can be performed. Further, the controller can disable the short timer, for instance, when the state actions should be performed anew. A long, or default, timer can be set for each respective state. If configuration actions at the state cannot be completed within the long timer, a state exit can occur. The long timer can be set to a reasonable duration so as to allow completion of the state actions. The short timer, in contrast, may be considerably shorter making it, in some cases, impossible to perform the state actions without reference back to previously-performed state actions, among other examples.

In some instances, during initialization (or re-initialization) of a link, as agents progress through a state machine toward an operational link state, one or more failures or state exits can occur that cause the state to reset (e.g., to a reset or other state). In effect, the initialization of the link can loop through one or more states without completing the initialization and entering a link state. In one example, a count can be maintained for the number of unproductive loops in state transitions within the initialization of a link. For instance, each time an initialization returns to a reset state without reaching a link state a counter can be incremented. The counter can be reset for the link once the link successfully enters a link state. Such counters can be maintained by agents on both sides of the link. Further, a threshold can be set, for instance, by a software-based controller utilizing one or more external control points. When the count of unproductive loops meets (or exceeds) the defined threshold initialization of the link can be suspended (e.g., set and held at or before the reset state). In some implementations, in order to recommence initialization and release the initialization from the suspended state, a software-based controller can trigger a restart or re-initialization of the link. In some instances, the software-based tools can analyze the nature of the suspended initialize and perform diagnostics, set register values, and perform other operations so as to guard against further looping of the initialization. Indeed, in some implementations, a controller can set a higher counter threshold or even override the counter, among other examples, in connection with restarting a suspended link initialization.

In some implementations of HPI, supersequences can be defined, each supersequence corresponding to a respective state or entry/exit to/from the respective state. A supersequence can include a repeating sequence of data sets and symbols. The sequences can repeat, in some instances, until completion of a state or state transition, or communication of a corresponding event, among other examples. In some instances, the repeating sequence of a supersequence can repeat according to a defined frequency, such as a defined number of unit intervals (UIs). A unit interval (UI) can correspond to the interval of time for transmitting a single bit on a lane of a link or system. In some implementations, the repeating sequence can begin with an electrically ordered set (EOS). Accordingly, an instance of the EOS can be expected to repeat in accordance with the predefined frequency. Such ordered sets can be implemented as defined 16 Byte codes that may be represented in hexadecimal format, among other examples. In one example, the EOS of a supersequence can be an EIEIOS. In one example, an EIEOS can resemble a low frequency clock signal (e.g., a predefined number of repeating FF00 or FFF000 hexadecimal symbols, etc.). A predefined set of data can follow the EOS, such as a predefined number of training sequences or other data. Such supersequences can be utilized in state transitions including link state transitions as well as initialization, among other examples.

In some implementations of an interconnect, such as in QPI, terminations of a serial data link can be brought on and off, such as when a link is reset or initialized. This approach can introduce complexity and time into the initialization of a link. In some implementations of HPI, terminations of the link can be maintained including during a reset or re-initialization of the link. Further, HPI can permit hot-plugging of devices. When another device is introduced, either through hot-plugging or otherwise, the voltage characteristics of the lane on which the new remote agent is added will change. The local agent can sense these changes in the lane voltage to detect the presence of the remote agent and prompt initialization of the link. State machine states and timers can be defined in the state machine to coordinate the detection, configuration, and initialization of a link without terminations.

In one implementation, HPI can support re-initialization on an in-band reset without changing the termination values through the screening of a lane by the receiving agent for incoming signaling. The signaling can be used to identify good lanes. As an example, the lane can be screened for any one of a set of pre-defined signals that are to be sent by a transmitter device to facilitate discovery and configuration of the link. In one example, a supersequence can be defined corresponding to one or more initialization or re-initialization tasks. The pre-defined sequence can include an electric idle exit ordered set (EIEOS) followed by additional sequence data. In some instances, as each device on either side of a lane becomes active, the devices can begin sending a supersequence corresponding to a particular initialization state, etc. In one embodiment, two types of pin resets can be supported; power-on (or "cold") reset and warm reset. A reset initiated by software or originating (in the Physical or another layer) on one agent may be communicated in-band to the other agent. However, due to usage of an embedded clock, an in-band reset may be handled by communication to another agent using an ordered set, such as a specific electrical ordered set or EIOS.

The ordered set can be sent during initialization and a PHY control sequence (or "blocking link state") can be sent after initialization. The block link state can block the link layer from sending flits. As another example, link layer traffic may be blocked to send a few NULL flits which may be discarded at the receiver.

As introduced above, initialization, in one embodiment, can be done initially at slow speed followed by initialization at fast speed. Initialization at slow speed uses the default values for the registers and timers. Software then uses the slow speed link to setup the registers, timers and electrical parameters and clears the calibration semaphores to pave the way for fast speed initialization. As one example, initialization can consist of such states or tasks as Reset, Detect, Polling, Compliance, and Configuration, among potentially others.

In one example, a link layer blocking control sequence (i.e. a blocking link state (BLS) or L0c state) can include a timed state during which the link layer flits are held off while the PHY information is communicated to the remote agent. Here, the transmitter and receiver may start a block control sequence timer. And upon expiration of the timers, the transmitter and receiver can exit the blocking state and may take other actions, such as exit to reset, exit to a different link state (or other state), including states that allow for the sending of flits across the link.

In one embodiment, link training can be provided and include the sending of one or more of scrambled training sequences, ordered sets, and control sequences, such as in connection with a defined supersequence. A training sequence symbol may include one or more of a header, reserved portions, a target latency, a pair number, a physical lane map code reference lanes or a group of lanes, and an initialization state. In one embodiment, the header can be sent with a ACK or NAK, among other examples. As an example, training sequences may be sent as part of supersequences and may be scrambled.

In one embodiment, ordered sets and control sequences are not scrambled or staggered and are transmitted identically, simultaneously and completely on all lanes. A valid reception of an ordered set may include checking of at least a portion of the ordered set (or entire ordered set for partial ordered sets). Ordered sets may include an electrically ordered set (EOS), such as an Electrical Idle Ordered Set (EIOS) or an EIEOS. A supersequence may include a start of a data sequence (SDS) or a Fast Training Sequence (FTS). Such sets and control supersequences can be predefined and may have any pattern or hexadecimal representation, as well as any length. For example, ordered sets and supersequences may be a length of 8 bytes, 16, bytes, or 32 bytes, etc. FTS, as an example, can additionally be utilized for fast bit lock during exit of a partial width transmitting link state. Note that the FTS definition may be per lane and may utilize a rotated version of the FTS.

Supersequences, in one embodiment, can include the insertion of an EOS, such as an EIEOS, in a training sequence stream. When signaling starts, lanes, in one implementation, power-on in a staggered manner. This may result, however, in initial supersequences being seen truncated at the receiver on some lanes. Supersequences can be repeated however over short intervals (e.g., approximately one-thousand unit intervals (or ~1 KUI)). The training supersequences may additionally be used for one or more of deskew, configuration and for communicating initialization target, lane map, etc. The EIEOS can be used for one or more of transitioning a lane from inactive to active state, screening for good lanes, identifying symbol and TS boundaries, among other examples.

In one embodiment, the clock can be embedded in the data so there are no separate clock lanes. The flits sent over the lanes can be scrambled to facilitate clock recovery. The receiver clock recovery unit, as one example, can deliver sampling clocks to a receiver (i.e. the receiver recovers clock from the data and uses it to sample the incoming data). Receivers in some implementations continuously adapt to an incoming bit stream. By embedding the clock, pinout can be potentially reduced. However, embedding the clock in the in-band data can alter the manner in which in-band reset is approached. In one embodiment, a blocking link state (BLS) can be utilized after initialization. Also, electrical ordered set supersequences may be utilized during initialization to facilitate the reset (e.g., as described above), among other considerations. The embedded clock can be common between the devices on a link and the common operational clock can be set during calibration and configuration of the link. For instance, HPI links can reference a common clock with drift buffers. Such implementation can realize lower latency than elastic buffers used in non-common reference clocks, among other potential advantages. Further, the reference clock distribution segments may be matched to within specified limits.

In some implementations, HPI may support flits with a width that is, in some cases, not a multiple of the nominal lane width (e.g. using a flit width of 192 bits and 20 lanes as a purely illustrative example). Indeed, in implementations permitting partial width transmitting states, the number of lanes over which flits are transmitted can fluctuate, even during the life of the link. For example, in some instances, the flit width may be a multiple of the number of active lanes at one instant but not be a multiple of the number of active lanes at another instant (e.g., as the link changes state and lane width). In instances where the number of lanes is not a multiple of a current lane width (e.g., the example of a flit width of 192 bits on 20 lanes), in some embodiments, consecutive flits can be configured to be transmitted to overlap on lanes to thereby preserve bandwidth (e.g., transmitting five consecutive 192 bit flits overlapped on the 20 lanes).

FIG. 8 illustrates a representation of transmission of consecutive flits overlapped on a number of lanes. For instance, FIG. 8 shows a representation of five overlapping 192-bit flits sent over a 20 lane link (the lanes represented by columns 0-19). Each cell of FIG. 8 represents a respective "nibble" or grouping of four bits (e.g., bits 4$n$+3:4$n$) included in a flit sent over a 4 UI span. For instance, a 192 bit flit can be divided into 48 four-bit nibbles. In one example, nibble 0 includes bits 0-3, nibble 1 includes bits 4-7, etc. The bits in the nibbles can be sent so as to overlap, or be interleaved (e.g., "swizzled"), such that higher-priority fields of the flit are presented earlier, error detection properties (e.g., CRC) are retained, among other considerations. Indeed, a swizzling scheme can also provide that some nibbles (and their respective bits) are sent out of order (e.g., as in the examples of FIGS. 8 and 9). In some implementations, a swizzling scheme can be dependent on the architecture of the link layer and format of the flit used in the link layer.

The bits (or nibbles) of a flit with a length that is not a multiple of the active lanes can be swizzled, such as according to the example of FIG. 8. For instance, during the first 4 UI, nibbles 1, 3, 5, 7, 9, 12, 14, 17, 19, 22, 24, 27, 29, 32, 34, 37, 39, 42, 44 and 47 can be sent. Nibbles 0, 2, 4, 6, 8, 11, 13, 16, 18, 21, 23, 26, 28, 31, 33, 36, 38, 41, 43, and 46 can be sent during the next 4 UI. In UIs 8-11, only eight nibbles remain of the first flit. These final nibbles (i.e., 10, 15, 20, 25, 30, 40, 45) of the first flit can be sent concurrently with the first nibbles (i.e., nibbles 2, 4, 7, 9, 12, 16, 20, 25, 30, 35, 40, 45) of the second flit, such that the first and second flits overlap or are swizzled. Using such a technique, in the present example, five complete flits can be sent in 48 UI, with each flit sent over a fractional 9.6 UI period.

In some instances, swizzling can result in periodic "clean" flit boundaries. For instance, in the example of FIG. 8, the starting 5-flit boundary (the top line of the first flit) may also be referred to as a clean flit boundary since all lanes are transmitting starting nibble from same flit. Agent link layer logic can be configured to identify swizzling of lanes and can reconstruct the flit from the swizzled bits. Additionally, physical layer logic can include functionality for identifying when and how to swizzle a stream of flit data based on the number of lanes being used at the moment. Indeed, in a transition from one link width state to another, agents can configure themselves to identify how swizzling of the data stream will be employed.

As noted above, links can transition between lane widths, in some instances operating at an original, or full, width and later transitioning to (and from) a partial width utilizing fewer lanes. In some instances, the defined width of a flit may be divisible by the number of lanes. For instance, the example of FIG. 9 illustrates such an example, where the 192-bit flit of the previous examples is transmitted over an 8-lane link. As represented in FIG. 9, O-bit nibbles of a 192-bit flit can be evenly distributed and transmitted over 8 lanes (i.e., as 192 is a multiple of 8). Indeed, a single flit may be sent over 24 UI when operating at an 8-lane partial width. Further, each flit boundary can be clean in the example of FIG. 9. While clean flit boundaries can simplify the state transitions, determinism, and other features, allowing for swizzling and occasional jagged flit boundaries can allow for the minimization of wasted bandwidth on a link.

Additionally, while the example of FIG. 9, shows lanes 0-7 as the lanes that remained active in a partial width state, any set of 8 lanes can potentially be used. Note also that the examples above are for purposes of illustration only. The flits can potentially be defined to have any width. Links can also have potentially any link width. Further, the swizzling scheme of a system can be flexibly constructed according to the formats and fields of the flit, the preferred lane widths in a system, among other considerations and examples.

The operation of the HPI PHY logical layer can be independent of the underlying transmission media provided the latency does not result in latency fixing errors or timeouts at the link layer, among other considerations.

Link Layer

The Link layer can abstract the Physical layer from the Protocol layer, handle flow control between two protocol agents, and provide virtual channel services to the Protocol layer (Message Classes) and Routing layer (Virtual Networks). In some implementations, the Link layer can deal with a fixed quantum of information, termed a flit. In one example, the flit can be defined to be 192 bits in length. However, any range of bits, such as 81-256 (or more) may be utilized in different variations. A large flit size, such as 192 bits, may include format, cyclic redundancy check (CRC), error correction code (ECC), and other features. For instance, a larger flit length can also permit the CRC field to be expanded (e.g., to 16 bits) to handle the larger flit payload. The number of phits or unit intervals (UI) (e.g., the time used to transfer a single bit or phit, etc.) to transfer a single flit can vary with link width. For instance, a 20 lane or bit link width can transfer a single 192 bit flit in 9.6 UI, while an 8 lane link width transfers the same flit in 24 UI, among other potential examples. The link layer crediting and protocol packetizing can also be based on a flit.

Figure 10:
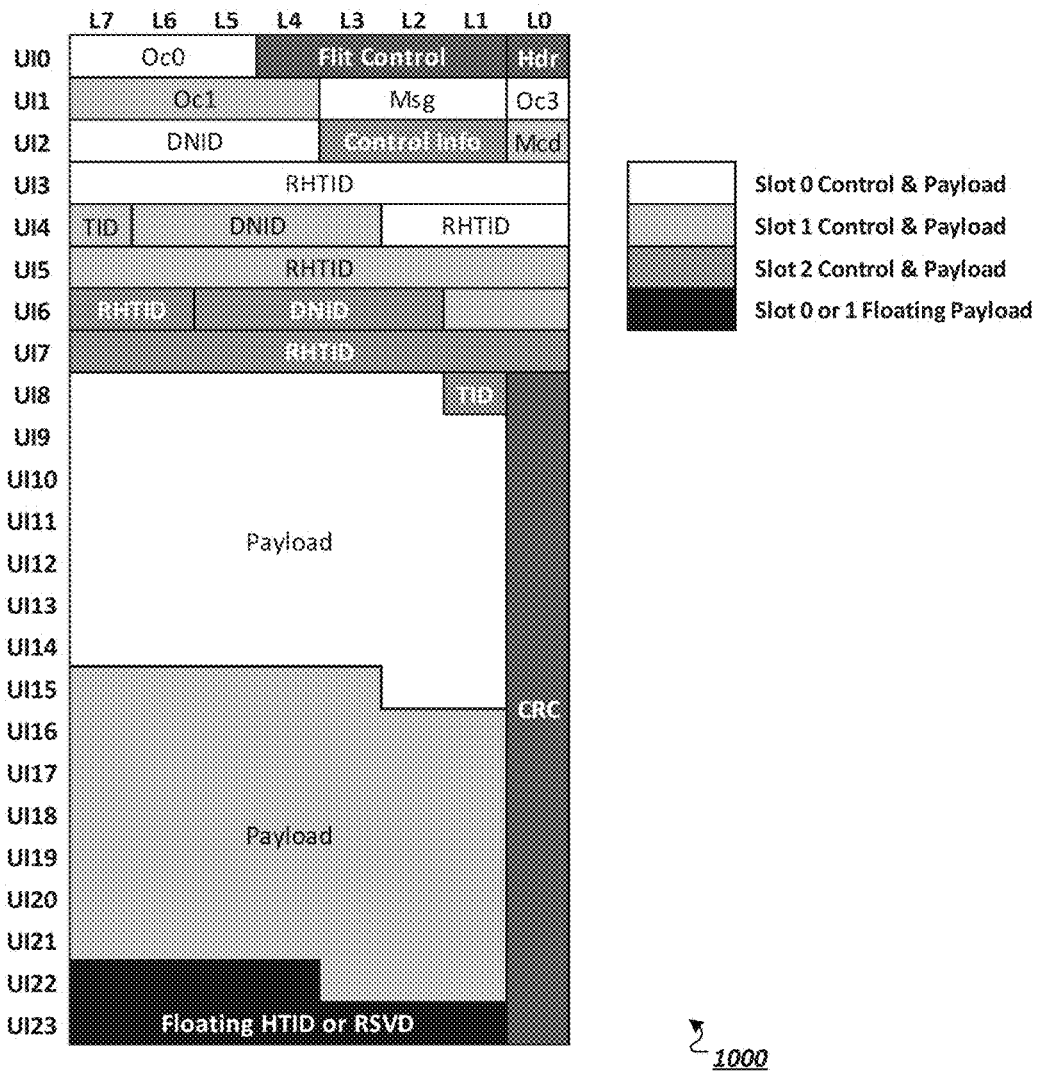
FIG. 10 illustrates a representation of an example multi-slot flit.

FIG. 10 illustrates a representation 1000 of a generalized flit for an 8 lane link width. Each column of the representation 1000 can symbolize a link lane and each row a respective UI. In some implementations, a single flit can be subdivided into two or more slots. Distinct messages or link layer headers can be included in each slot, allowing multiple distinct, and in some cases, independent messages corresponding to potentially different transactions to be sent in a single flit. Further, the multiple messages included in slots of a single flit may also be destined to different destination nodes, among other examples. For instance, the example of FIG. 10 illustrates a flit format with three slots. The shaded portions can represent the portion of the flit included in a respective slot.

In the example of FIG. 10, three slots, Slots 0, 1, and 2, are provided. Slot 0 can be provided 72 bits of flit space, of which 22 bits are dedicated to message header fields and 50 bits to message payload space. Slot 1 can be provided with 70 bits of flit space, of which 20 bits are dedicated to message header fields and 50 bits to message payload space. The difference in message header field space between can be optimized to provide that certain message types will be designated for inclusion in Slot 0 (e.g., where more message header encoding is utilized). A third slot, Slot 2, can be provided that occupies substantially less space than Slots 0 and 1, in this case utilizing 18 bits of flit space. Slot 2 can be optimized to handle those messages, such as acknowledges, credit returns, and the like that do no utilize larger message payloads. Additionally, a floating payload field can be provided that allows an additional 11 bits to be alternatively applied to supplement the payload field of either Slot 0 or Slot 1.

Continuing with the specific example of FIG. 10, other fields can be global to a flit (i.e., apply across the flit and not to a particular slot). For instance, a header bit can be provided together with a 4-bit flit control field that can be used to designate such information as a virtual network of the flit, identify how the flit is to be encoded, among other examples. Additionally, error control functionality can be provided, such as through a 16-bit cyclic CRC field, among other potential examples.

A flit format can be defined so as to optimize throughput of messages on the Link layer. Some traditional protocols have utilized unslotted, smaller flits. For instance, in QPI an 80-bit flit was utilized. While the flit throughput of a larger (e.g., 192-bit flit) may be lower, message or packet throughput can be increased by optimizing use of the flit data. For instance, in some implementations of QPI, the entire 80-bit flit space was utilized regardless of the message size or type. By subdividing a larger flit into slots of predetermined lengths and fields, the 192 flit length can be optimized realizing higher efficiency even in instances when one or more of the available slots are sometimes unused. Indeed, Link layer traffic can be assumed to include many different types of messages and traffic, including messages and packets with varying header lengths and fields. The respective lengths and organization of slots defined in a flit can be defined so as to correspond with the statistical or expected frequency of various messages and the needs of these messages. For instance, two larger slots can be defined for every small slot, to accommodate an expected statistical frequency of messaging using these larger message types and header lengths, among other example. Further, flexibility can also be provided to further accommodate the varied traffic, such as through a floating payload field, as in the example of FIG. 10. In some instances, a flit format can be fixed, including the bits dedicated to particular slots in the flit.

In the example of FIG. 10, a "Hdr" field can be provided for the flit generally and represent a header indication for the flit. In some instances, the Hdr field can indicate whether the flit is a header flit or a data flit. In data flits, the flit can still remain slotted, but omit or replace the use of certain fields with payload data. In some cases, data fields may include an opcode and payload data. In the case of header flits, a variety of header fields can be provided. In the example of FIG. 10, "Oc" fields can be provided for each slot, the Oc field representing an opcode. Similarly, one or more slots can have a corresponding "msg" field representing a message type of the corresponding packet to be included in the slot, provided the slot is designed to handle such packet types, etc. "DNID" fields can represent a Destination Node ID, a "TID" field can represent a transaction or tracker ID, a "RHTID" field can represent either a requestor node ID or a home tracker ID, among other potential fields. Further, one or more slots can be provided with payload fields. Additionally, a CRC field can be included within a flit to provide a CRC value for the flit, among other examples.

In some implementations, link width can vary during the life of the link. For instance, the Physical layer can transition between link width states, such as to and from a full or original lane width and a different or partial lane width. For example, in some implementations, a link can be initialized to transfer data over 20 lanes. Later, the link can transition to a partial width transmitting state where only 8 lanes are actively used, among many other potential examples. Such lane width transitions can be utilized, for instance, in connection with power management tasks governed by one or more power control units (PCU) among other examples.

As noted above, link width can influence flit throughput rate. FIG. 11 is a representation of an example 192-bit flit sent over an 8 lane link, resulting in throughput of the flit at 24 UI. Further, as shown in the example of FIG. 11, bits of the flit can be sent out of order in some instances, for example, to send more time-sensitive fields earlier in the transfer (e.g., flit type fields (e.g., data or header flit), opcodes, etc.), preserve or facilitate particular error detection or other functionality embodied in the flit, among other examples. For instance, in the example of FIG. 11, bits 191, 167, 143, 119, 95, 71, 47, and 23 are sent in parallel on lanes L7 through L0 during a first UI (i.e., UI0) of transfer, while bits 168, 144, 120, 96, 72, 48, 24, and 0 are sent during the $24^{th}$ (or final) UI of the flit transfer (i.e., UI23). It should be appreciated that other ordering schemes, flit lengths, lane widths, etc. can be utilized in other implementations and examples.

In some instances, the length of the flit can be a multiple of the number of active lanes. In such instances, the flit can be transmitted evenly on all active lanes and transfer of the flit can end substantially simultaneously at a clean (i.e., non-overlapping) boundary. For example, as shown in the representation of FIG. 8, bits of a flit can be considered to be transmitted in consecutive groupings of 4 bits, or "nibbles." In this example, a 192 bit flit is to be transferred over an 8 lane link. As 192 is a multiple of 8, the entire flit can be cleanly transferred over the 8 lane link in 24 UI. In other instances, the flit width may not be a multiple of the number of active lanes. For instance, FIG. 9 shows another representation of an example 192 bit transferred over 20 lanes. As 192 is not evenly divisible by 20, transfer of the full flit would require a non-integer number of intervals (e.g., 9.6 UI). In such cases, rather than wasting "extra" lanes not utilized during the 10th UI of transfer, a second overlapping flit can be transferred with the final bits of a preceding flit. Such overlapping, or swizzling, of the flits can result in jagged flit boundaries and flit bits sent out of order in some implementations. The pattern utilized for the transfer can be configured to allow more time-sensitive fields of the flit to be transferred earlier in the flit, preservation of error detection and correction, among other considerations. Logic can be provided in one or both of the Physical and Link layers to transfer flit bits according to such patterns and dynamically change between patterns based on the current link width. Further logic can be provided to re-order and re-construct flits from such swizzled or ordered bit streams, among other examples.

In some implementations, flits can be characterized as header flits (e.g., bearing packet header data) or data flits (e.g., bearing packet payload data). Returning to FIG. 10, a flit format can be defined that includes three (3) distinct slots (e.g., 0, 1, and 2), allowing up to three headers to be transferred in a single flit (e.g., one header in each slot). In the example of FIG. 10, three slots, Slots 0, 1, and 2, are provided. Slot 0 can be provided 72 bits of flit space, of which 22 bits are dedicated to message header fields and 50 bits to message payload space. Slot 1 can be provided with 70 bits of flit space, of which 20 bits are dedicated to message header fields and 50 bits to message payload space. The difference in message header field space between can be optimized to provide that certain message types will be designated for inclusion in Slot 0 (e.g., where more message header encoding is utilized). A third slot, Slot 2, can be provided that occupies substantially less space than Slots 0 and 1, in this case utilizing 18 bits of flit space. Slot 2 can be optimized to handle those messages, such as acknowledges, credit returns, and the like that do no utilize larger message payloads. Additionally, a floating payload field can be provided that allows an additional 11 bits to be alternatively applied to supplement the payload field of either Slot 0 or Slot 1.

In some implementations, by allowing a field to float between the two slots, extra bits can be provided as needed for certain messages while still staying within a predefined flit length (e.g., 192 bits) and maximizing the utilization of the bandwidth. Turning to the examples of FIG. 19, two instances 1905, 1910 of an example 192-bit flit are shown on an 8 lane data link. In one instance, a flit (e.g., 1905) can include three slots, Slots 0, 1, and 2. Each of Slots 0 and 1 can include 50-bit payload fields. The floating field can be provided to alternatively extend the payload field of the either Slot 0 or Slot 1 by the field length (e.g., 11 bits) of the floating field. The use of a floating field can further extend the efficiency gains provided through a defined, multi-slot flit format. The sizing of the slots within the flit, and the types of messages that can be placed in each slot, can potentially provide increased bandwidth even with a reduced flit rate.

In the particular example of FIG. 10, the messages that can use Slots 1 and 2 can be optimized, reducing the number of bits to be set aside to encode these slots' opcodes. When a header having more bits that Slot 0 can provide enters the Link layer, slotting algorithms can be provided to allow it to take over Slot 1 payload bits for additional space. Special control (e.g. LLCTRL) flits may also be provided that consume all three slots worth of bits for their needs. Slotting algorithms may also exist to allow individual slots to be utilized while other slots carry no information, for cases where the link is partially busy.

Figure 12:
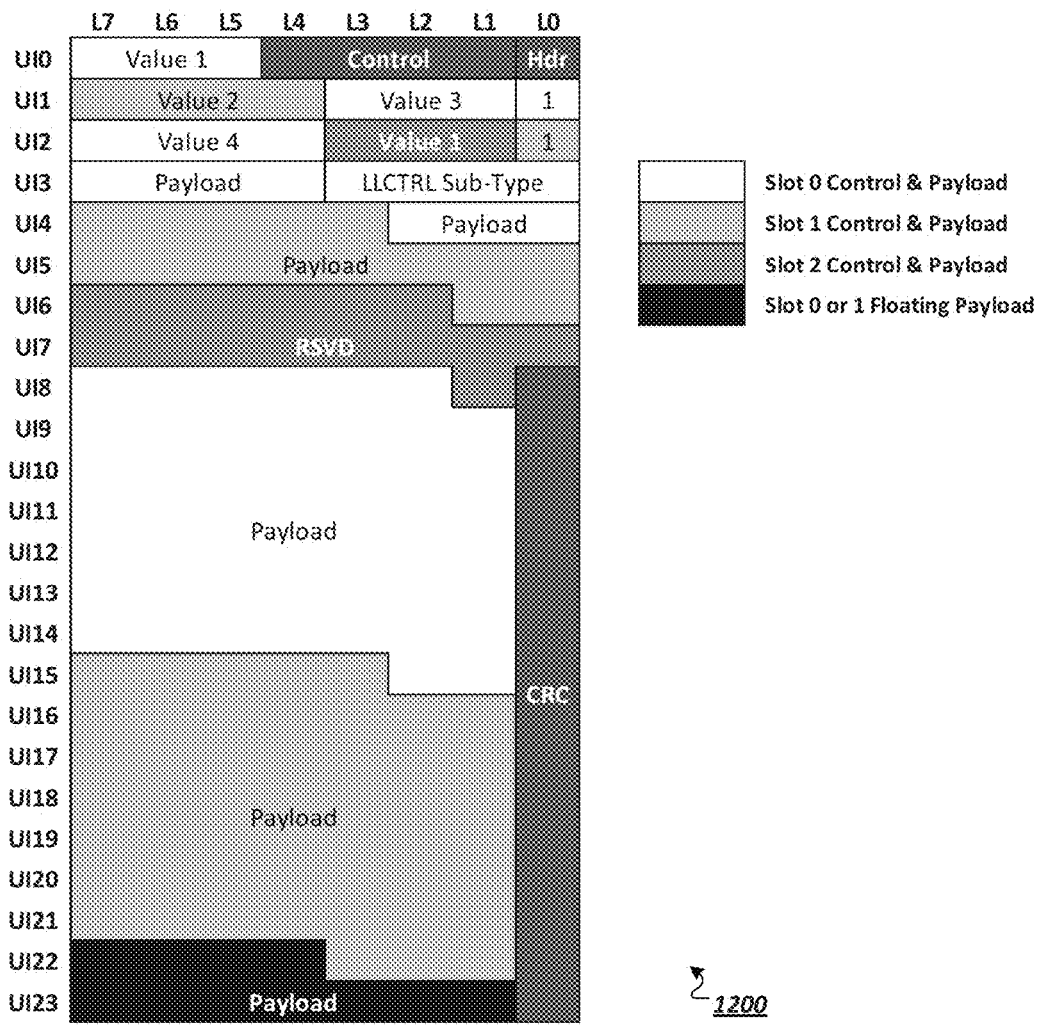
FIG. 12 illustrates a representation of an example multi-slot flit including a debug message.

In one embodiment, the Link Layer can additionally define special control flits that may be used, for instance, for debug messages and other uses. In one example, LLCTRL-DEBUG flits may be sent by the Link Layer when an enable debug control field is set. When this bit is not set, LLCTRL-DEBUG flits may not be transmitted on the link Debug Packets may be important to expose internal states of devices connected by HPI that are otherwise inaccessible. The contents of debug packets can also be implementation specific. Contents could include things like branch info (source and target IPs), time-stamps, indication of an internal event trigger, and so on. The exposed data can be, for instance, by monitoring devices such as logic analyzers for post-processing and failure analysis. An example flit encoding of a Debug message type is illustrated in FIG. 12.

In some implementations, principles and protocols of a general purpose I/O interconnect (GPIO) architecture, such as HPI, can be utilized to implement a buffered memory interface and corresponding protocol. For instance, the physical and link layer definitions outlined above can also be implemented in a buffered memory protocol. Indeed, logic used to support the physical and link layers of the GPIO protocol can be reused at interfaces supporting the buffered memory protocol. The buffered memory protocol can also share message classes, such as a request, response, and writeback message class, among other examples. While opcode values within the buffered memory protocol message can be interpreted differently than in HPI (or another GPIO protocol), the same general packet formats can be utilized in both the buffered memory protocol and the GPIO interconnect upon which it is built. Indeed, additional packet and flit fields can be unique to both the buffered memory protocol and GPIO interconnect protocol.

In some implementations, a buffered memory protocol utilizing the physical and link layers of HPI can be a transactional interface and protocol. This can permit data to be returned out of order to a series of received requests (e.g., read requests). The buffered memory interface can be used to interconnect a buffer chip to a CPU in some implementations. In one implementation, While some protocols send DRAM commands such as Activate, Read, Write, and Refresh across a buffered memory bus, in some implementations of the buffered memory protocol discussed herein, a read or write command can simply be sent with an address. The buffer chip can then decode the specific rank and bank, and breaks the request down to DRAM commands. Speculative and demand reads can also be supported.

Figure 13:
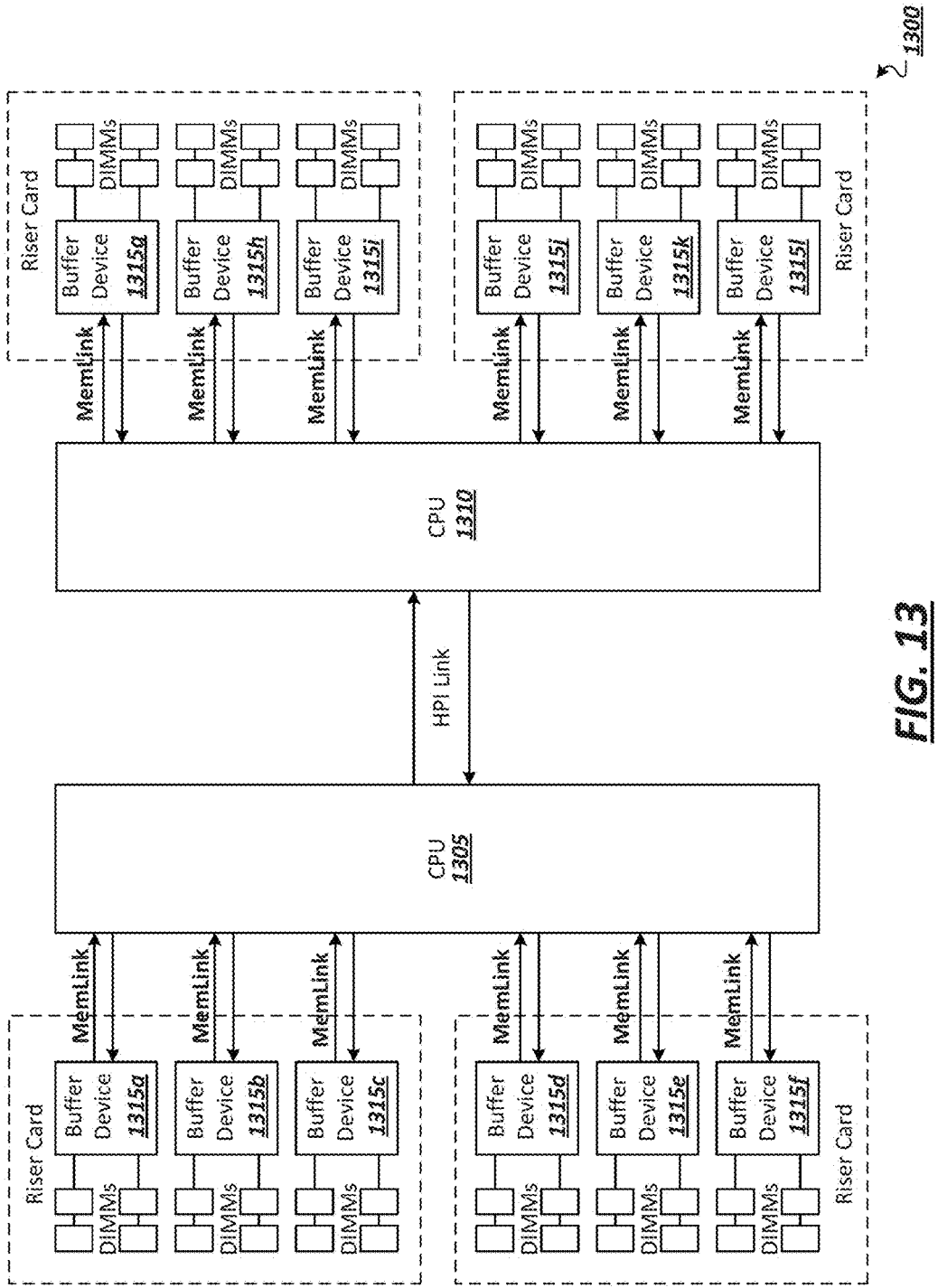
FIG. 13 illustrates a representation of a system utilizing a buffered memory protocol.

Turning to FIG. 13, a simplified block diagram 1300 is shown illustrating an example topology of a computing system including CPU devices 1305, 1310 interconnected by an HPI-compliant link. Each CPU 1305, 1310 can be likewise connected to one or more respective buffer devices 1315a-l using corresponding buffered memory protocol links ("MemLink"). As noted above, in some implementations, the buffered memory protocol interconnect can be based on the GPIO protocol, in that the physical and link layers of the buffered memory protocols are based on the same physical and link layer definitions of the GPIO protocol (e.g., HPI). Although not illustrated in FIG. 13, the CPUs 1305, 1310 can be further connected to one or more downstream devices using the GPIO protocol.

As further shown in the example of FIG. 13, buffer devices 1315a-l can be connected to memory devices, such as dual in-line memory module (DIMM) devices. The memory corresponding to each buffer device can be considered local to the CPU (e.g., 1305, 1301) to which the buffer device is connected. However, other devices (including the other CPU) can access the memory by other sockets using GPIO protocol-compliant links. In some implementations, a port running the buffered memory protocol may only support the commands for communicating with the memory and only support the buffered memory protocol (i.e., not the GPIO protocol and the buffered memory protocol). Additionally, in some implementations, the GPIO interconnect protocol may support routing and indicate such information (e.g., in its packets) such as the requesting and destination node identifiers. The buffered memory protocol, on the other hand, may be a point-to-point interface that does not utilize routing. Consequently, some fields used in the GPIO protocol may be dispensed with in packets sent using the buffered memory interfaces. Instead, fields can be designated for use in carrying address decode information host to buffer, among other examples.

In further implementations, buffer devices 1315a-l can support a two level memory topology with some amount of fast memory (e.g., DRAM) serving as a cache for a larger, slower memory (e.g., non-volatile memory). In one such implementation, one or more of the buffer devices 1315a-l can use DDR as near, fast memory and transactional DDR DIMMs as the larger "far" memory, among other examples. Transactional DIMMs can utilize protocols (e.g., DDR-Transactional (DDR-T)) to communicate to a volatile memory single in-line memory module (SIMM) using transactional commands.

Figure 14:
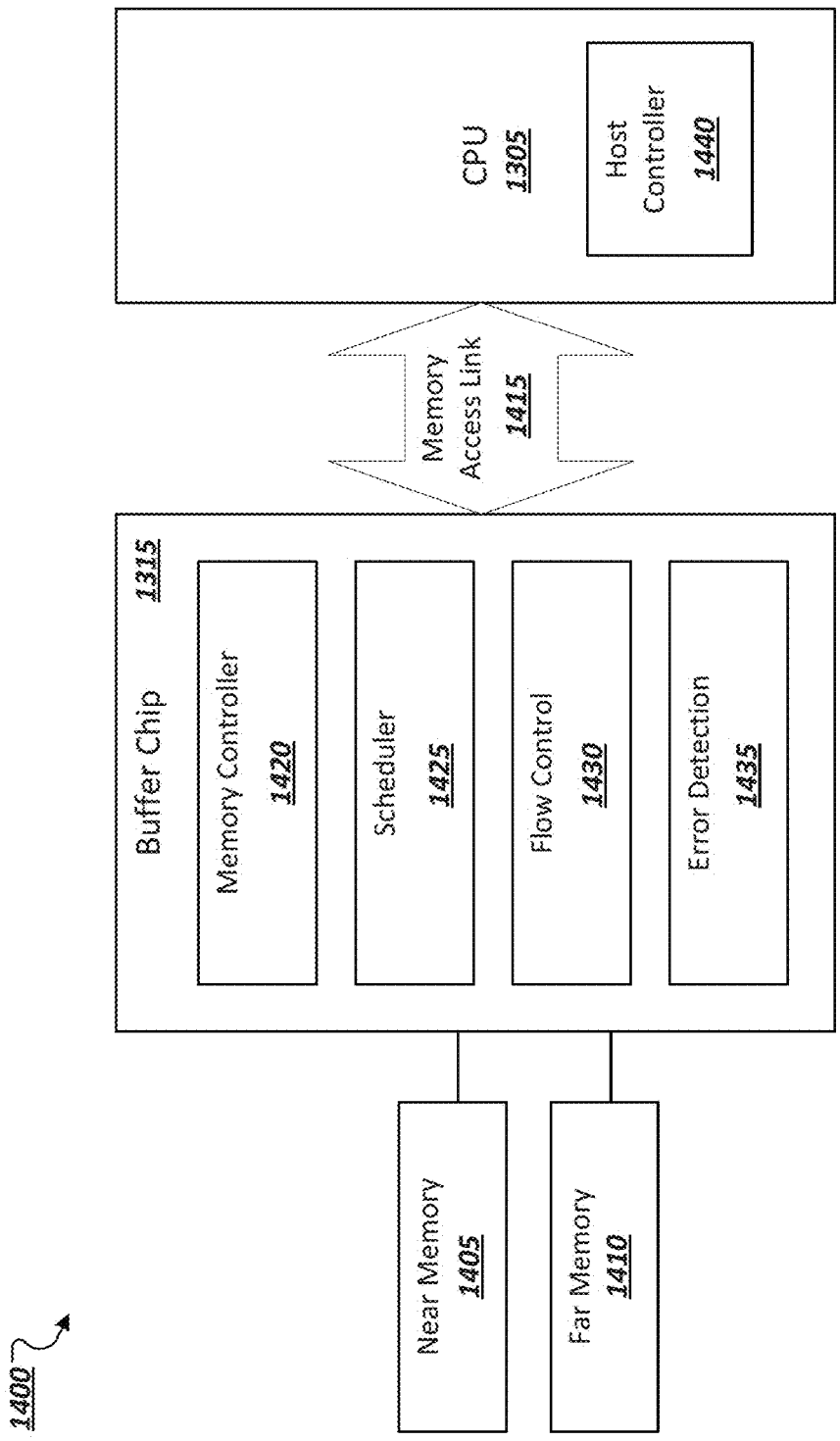
FIG. 14 illustrates a representation of a buffer device supporting a buffered memory protocol.

Turning to FIG. 14, a simplified block diagram 1400 is presented showing a more detailed representation of a buffer chip 1315 connected to near and far memory modules (e.g., 1405, 1410). As noted in the example above, the buffer chip 1315 can be communicatively coupled to a CPU device 1305 through a buffered memory protocol interconnect link 1415 utilizing a defined buffered memory protocol. The buffer chip 1315 can include logic to perform additional functions. For instance, an implementation of the buffer chip 1315 can include a memory controller 1420, a scheduler 1425, flow control logic 1430, and error detection logic 1435. Logic can be implemented using hardware circuitry, firmware, and/or software.

In some implementations, the memory controller 1420 can include logic to convert requests into the memory specific protocol (e.g., DDR4) of its memory devices. The memory controller 1420 can abstract the details of these memory-specific protocols from the host controller logic 1440 of the CPU 1305 (or another host) which communicates with the buffer chip 1315 using link 1415. Host controller logic 1440 can translate CPU (or host) addresses to memory addresses, including permuting across channels and sockets, among other functionality. Scheduler 1425 can include logic to reorder and arbitrate responses to requests in order to achieve higher performance. Buffer chip 1315 can additionally offer features such as flow control and error detection. In some implementations, flow control logic 1430 can be embodied in scheduler 1425 or otherwise interoperate with scheduler 1425 to ensure more efficiency and higher performance of the buffer chip 1315. Error detection logic 1440 can include logic to support an error correction code detection scheme as well as logic for initiating correction or handling of detected errors.

Figure 15A:
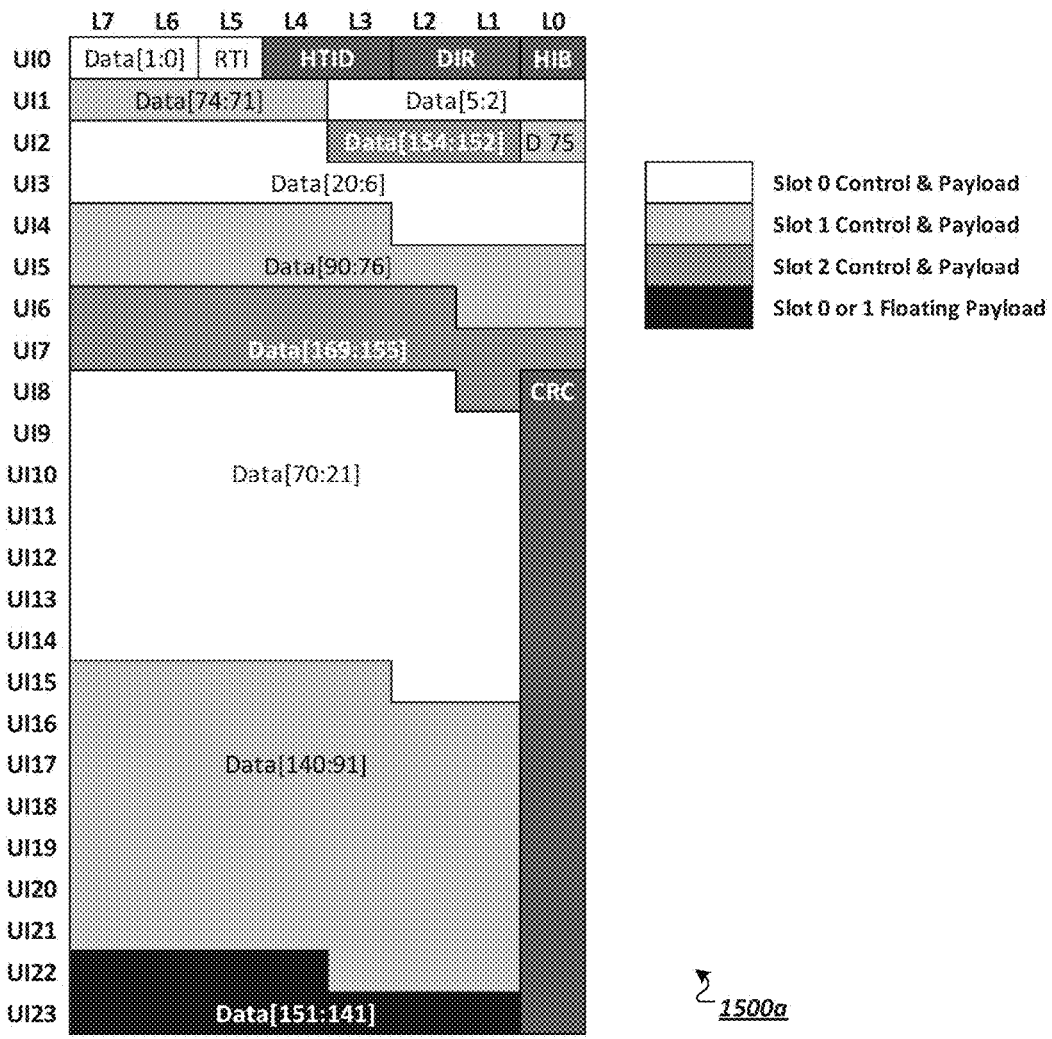
FIGS. 15A-15C illustrate representations of example flits in a buffered memory protocol.
Figure 15B:
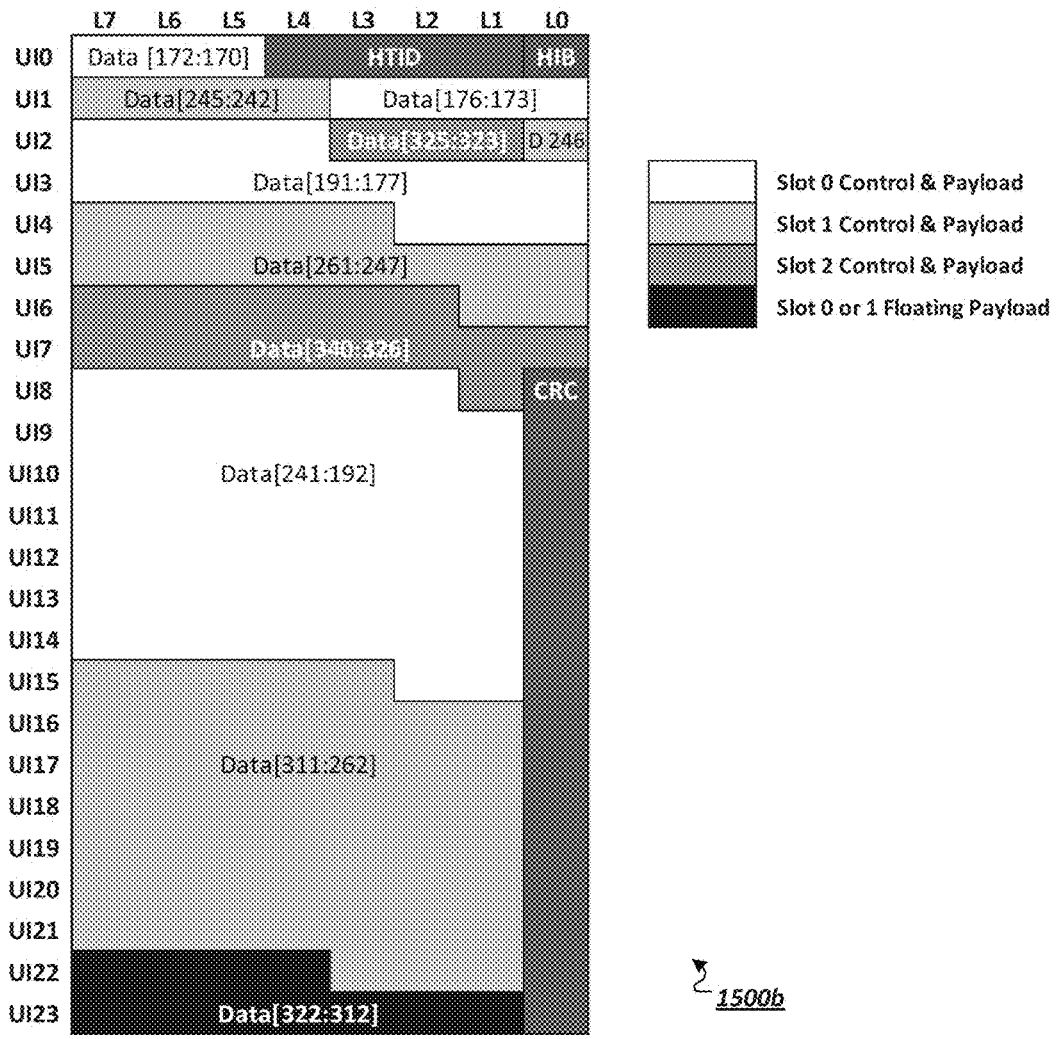
Figure 15C:
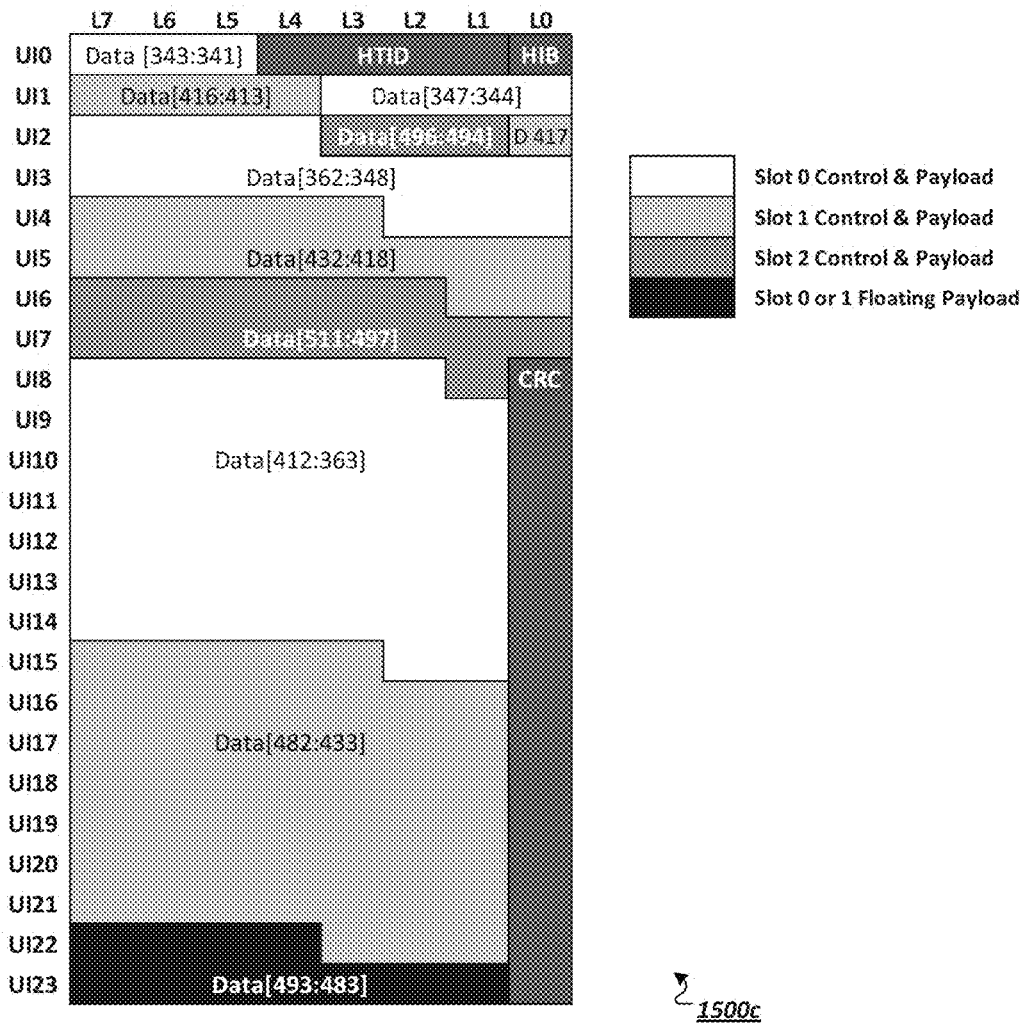

As noted above, the link layer of a buffered memory protocol can be based on that of a GPIO protocol. For instance, the 192-bit, 3-slot flit of an HPI protocol (e.g., described and shown in FIG. 10) can be utilized in a buffered memory protocol. A packet in the buffered memory protocol can embody an entire command. A packet can be implemented as one or more flits. FIGS. 15A-15C can represent implementations of a flit in a buffered memory protocol. In some implementations, read data can be sent back from the buffer device to a host via a combination of headered and headerless memory data (MemData) packets. An entire cache line can be transferred in three headerless flits (rather than five, as with headered flits). A headerless packet can thereby provide for higher throughput on what may be the most constrained portion of the interface. In order to fit into three flits, the headerless packet removes a number of fields and makes assumptions as to their values. The assumptions made may be true for most, but all read returns, If any assumptions are not true, the headered packet is to be used, which contains all fields. In some implementations, a headered packet can begin a sequence of read returns to permit early identification of a tracker identifier (e.g., HTID, RTID, etc.) for use in mapping a read return to a read request in a transactional buffered memory protocol.

In some implementations, headerless packets can contain the information outlined in Table 1:

TABLE 1

Headerless Packet Fields

| Field | Qty | Description |
| --- | --- | --- |
| Data | 512 | 64 byte cache line data |
| Directory | 2 | Two directory bits, which are stored with the data, generally as part of the ECC bits |
| HTID | 11 | Request transaction ID. Due to early HTID, the packet contains the HTID for the next read data packet |
| CRC | 48 | 16 bits per of CRC per flit |
| HIB | 3 | Header indication bit. One per flit. This bit is always 0 for each flit of headerless packets. |

Further, FIGS. 15A-15C illustrate a sequence of three flits (e.g., flit 0 (at FIG. 15A), flit 1 (at FIG. 15B), and flit 2 (at FIG. 15C)) that can be used to transmit an entire cache line in a read return. Table 2 provides a summary of an example of the three flits utilized in a headerless packet:

TABLE 2

Headerless Packet

| Flit | Contents |
| --- | --- |
| Data flit 0 | Data from the first 32 bytes of the cache line. |
| Data flit 1 | Remainder of the first 32 bytes, plus the first part of the second 32 bytes. |
| Data flit 2 | Remainder of the second 32 bytes |

An HIB bit can be set to indicate whether the packet is headered or headerless. HIB may be set to indicate a headerless packet only for data flits following a header flit. This allows certain other packets to be interleaved in the middle of a packet. When the interleaved packet is completed, the data portions of the original headered packet can be sent with HIB=0 in the flits. This technique can also be used to delay the data packets by inserting null flits. In some implementations, the start of a headerless packet is signaled by the HIB bit being a 0 when normally a header would be required. All other packets, including null flits, may contain a header with the HIB bit set.

As introduced above, headered packets may be a total of five flits in length, and may include one header flit and 4 data flits. In order to reduce idle latency, the headered flit may send data flit 1 twice. The first time it is sent with only the data from the first 32 bytes and is referred to as flit 1a. This allows the flit to be sent before the second 32 bytes of data is available from the memory devices. The result is that the critical 32 bytes chunk of data arrives earlier at the host for the idle case. Flit 1 can then be sent a second time, this time complete. It will contain a repeat of the first 32 byte data portion plus the second 32 byte portion. Table 3 describes the five flits of a headered packet:

TABLE 3

Headered Packet

| Flit | Contents |
| --- | --- |
| Header | Packet Header |
| Data flit 0 | Data from the first 32 bytes of the cache line |
| Data flit 1a | Remainder of the first 32 bytes only. Second 32-byte portion is reserved. The other flit payload bits (RTID[6:3]) are identical to Data Flit 1. |
| Data flit 1 | Complete Flit 1. First 32-byte portion is resent. Second 32-byte portion also included. |
| Data flit 2 | Remainder of the second 32 bytes. |

In some implementations, headered MemData packets may not be cancelled and are to be followed by the data flits. A header is not to be sent until it known that the data can also be sent. The full cache line may not be accumulated in the buffer before the header is sent.

Figure 16A:
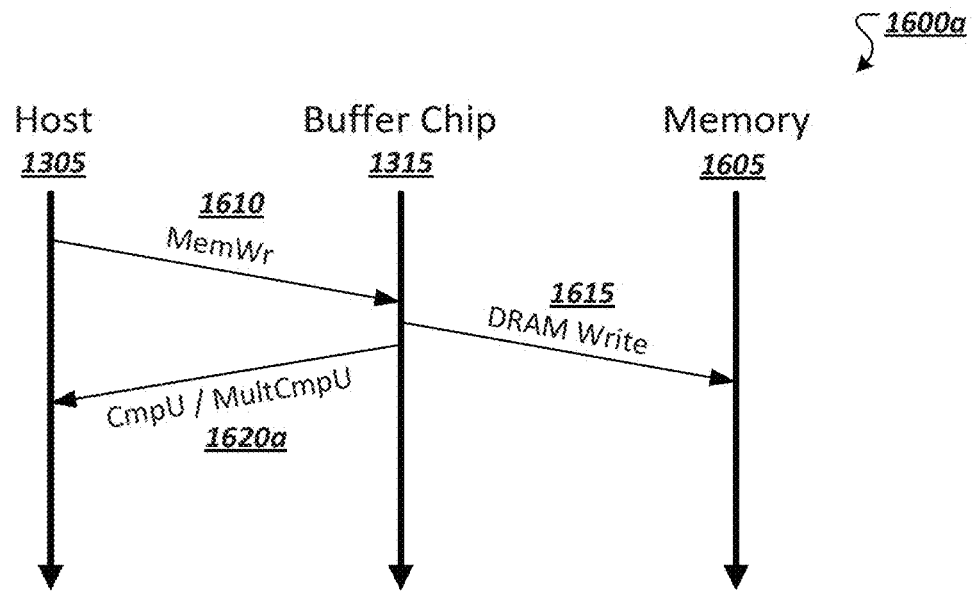
FIGS. 16A-16D are flow diagrams illustrating example memory write transactions.

A buffered memory interface can support a variety of different memory write commands to write data to memory. Memory writes can be sent from a host (e.g., 1305) to a buffer device (e.g., 1315) to be handled by the memory controller (e.g., 1420) of the buffer device (e.g., 1315). FIGS. 16A-16D are flow diagrams 1600a-d representing example memory write transactions that may be performed by a buffered memory interface (e.g., as defined by a buffered memory access protocol). For instance, FIG. 16A illustrates an example standard memory write (MemWr) command. Writes (e.g., 1615) to memory 1605 (controlled by a buffer device 1315) can be initiated by a memory write (MemWr) command 1610 and complete with a completion (e.g., 1620a) that is returned by the buffer device 1315 to the host 1305 to indicate the write. In some implementations, the completion can indicate whether or not the write was successful. A memory write command 1610 can include a transaction identifier (TID) and the corresponding completion can include be encoded with the same TID.

In one example of a memory write (MemWr) command 1610, the Write data and directory information can be sent along with the MemWr packet. In one implementation, the MemWr packet can include four flits (such as flits with the defined format as set forth above). In this example, the Write data can be encoded in the 2nd through 4th flits of the packet. The first flit can be a header flit, with the remaining three flits being data flits. In one example, utilizing a three slot flit format, the memory write appears only in a Slot 0, while Slots 1 and 2 of the packet may contain other commands. For instance, a memory read (MemRd) command may be in Slot 1, among other examples.

A single completion (CmpU) can be sent in a single packet. For instance, one or more slots of a flit can be dedicated to communicate the completion (CmpU) corresponding to a single memory write request. In other instances, the completion 1620a for the particular memory write 1610 can be returned in a packet that embodies a packed write completion (MultCmpu) in which multiple write completions corresponding to multiple memory writes by the buffer device are included, or "packed," in a single packet or flit in response multiple write requests of the host 1305. In some implementations, the completion (either CmpU or MultiCmpU) can be sent as soon as the corresponding write becomes globally visible (i.e., it need not wait for the write to complete to memory).

Figure 16B:
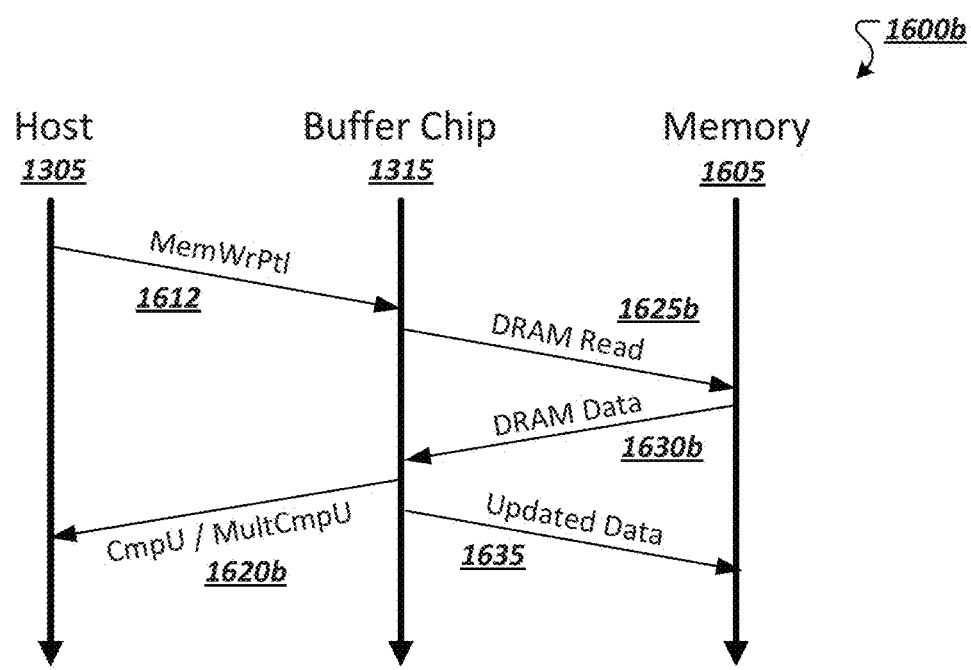

Turning to FIG. 16B, a memory write partial request transaction is represented. A memory write partial (MemWrPtl) request 1612 may be similar to a standard memory write (MemWr), except that a byte mask (e.g., a 64-bit byte mask) is sent along with the MemWrPtl packet. In an implementation using a three-slot flit, the byte mask can takes the place of Slots 1 and 2 in the header flit of the MemWrPtl. The MemWrPtl command 1612 can result in a read-modify-write (RMW) to memory (e.g., at 1625b, 1630b, 1635), merging the read data with the partial write data. The directory can be updated with the directory data sent with the MemWrPtl. As with a memory write (MemWr), the response to the MemWrPtl can either be a CmpU or MultCmpU (1620b), which can be sent when the partial write becomes globally visible. In some instances, the completion 1620b might wait for the read portion to complete to simplify logic in the memory controller (e.g., this would avoid the case of a future read to the same address hitting an only partially valid cache line in a buffer). Any future read after the completion 1620b will return the merged data.

Figure 16C:
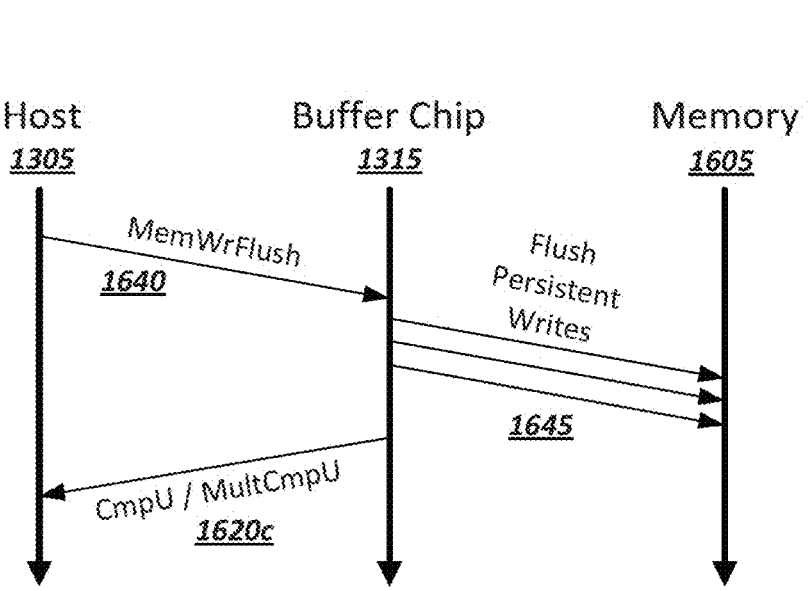

FIG. 16C illustrates a memory write flush flow transaction. The memory write flush flow (MemWrFlush) command 1640 can be sent as a result of the Persistent Commit in the CPU or host 1305. The MemWrFlush command 1640 can be sent to the specific memory controller targeted by the address. The purpose of the command 1640 may be to cause the buffer device 1315 to commit all previous writes to persistent memory (at 1645). The memory controller can flush 1645 all pending writes to persistent memory before sending the completion 1620c back to the host. The completion 1620 should not be sent to the host 1305 until the memory controller (at 1315) has assured that the data will make it to persistent memory. In the case of DDR-T this means that any DDR-T error flow involving these writes has completed, and it is assured that the data has been received correctly by the DDR-T DIMM. From that point the DDR-T DIMM will assure that the data is written to persistent memory even in the case of a power failure. The MemWrFlush command 1640 may also be completed with either a CmpU or MultCmpU.

Figure 16D:
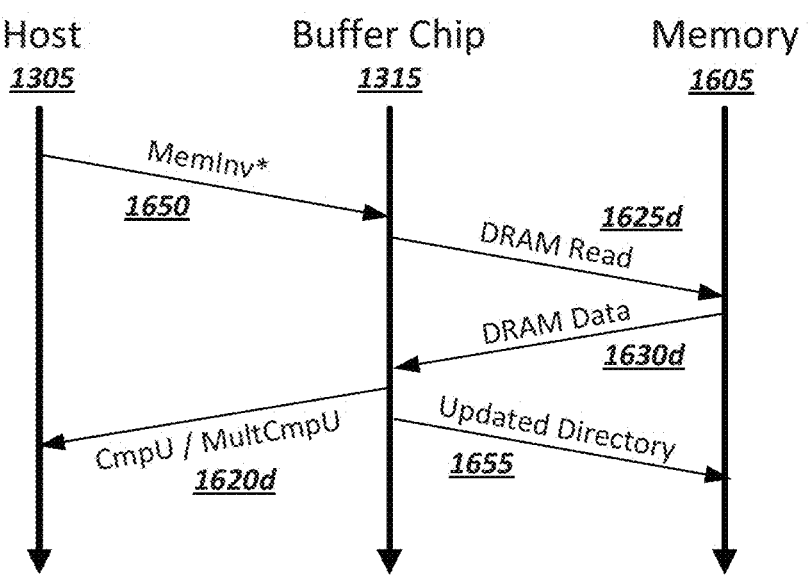

As another example, FIG. 16D represents a transaction involving an invalidate command (MemInv) 1650. An invalidate command 1650 does not return read data, but rather, is to update the directory (at 1655), which can include reading the current directory state (e.g., at 1625d, 1630d) and then writing a change (in needed) to the directory (at 1655). Invalidate commands (e.g., 1650) can comprise multiple types of invalidate commands. A buffer device (e.g., 1315) can respond to any such invalidate command 1650 using either a single completion CmpU or packed completion MultCmpU. Other memory writes can include, for instance, memory write inclusive commands and memory write inclusive partial non-inclusive commands, among other potential examples. Respective completions (e.g., CmpU or MultCmpU) can be returned by the buffer device in response.

Systems can be particularly sensitive to latency. Memory latency can be critical for CPU performance. Performance of memory accesses over a buffered interconnect can be improved to enhance CPU performance. For instance, by increasing link bandwidth, memory latency can be reduced at high utilization. In one implementation, the read bandwidth of a memory link can be at least partially optimized by minimizing overhead when completing memory write transactions.

In a high bandwidth condition a buffered memory interface from the memory controller to a host may be mostly consumed sending read data back to a host core. However, writes may also be sent, together with corresponding completions. Unlike reads or other commands, write completions may not be latency sensitive, in the sense that forward progress of the master is not delayed or dependent on a completion to a corresponding write request. However, write completions cannot be held indefinitely, as sending completion messages allows the host to free up buffer resources to allow new transactions to issue. Further, write completions are generally much smaller than read responses, as write completions typically do not carry data returned from memory.

In one example, a buffer device and its component logic implemented, at least partially, in hardware of the buffer device, can wait to send write completions to multiple completed memory writes such that multiple write completions can be sent at once (e.g., in a single flit), thus spreading the associated overhead across multiple write completions. Further, such packed write completions can be sent in-band, as other completions, and does not necessitate the provision of additional wires or other features that might drive additional silicon, power, and/or platform costs. A packed, or multiple, write completion can assist in optimizing buffered memory bandwidth by reducing the amount of bandwidth consumed by write completions. Instead of letting write completions consume a flit's worth of bus bandwidth, as is the traditional quantum for messages over some implementations of a buffered memory link, multiple write completions can be tightly packed into a single flit. Logically this single flit then looks like many write completions, and frees up space on the bus for more read data, among other example advantages.

Figure 17A:
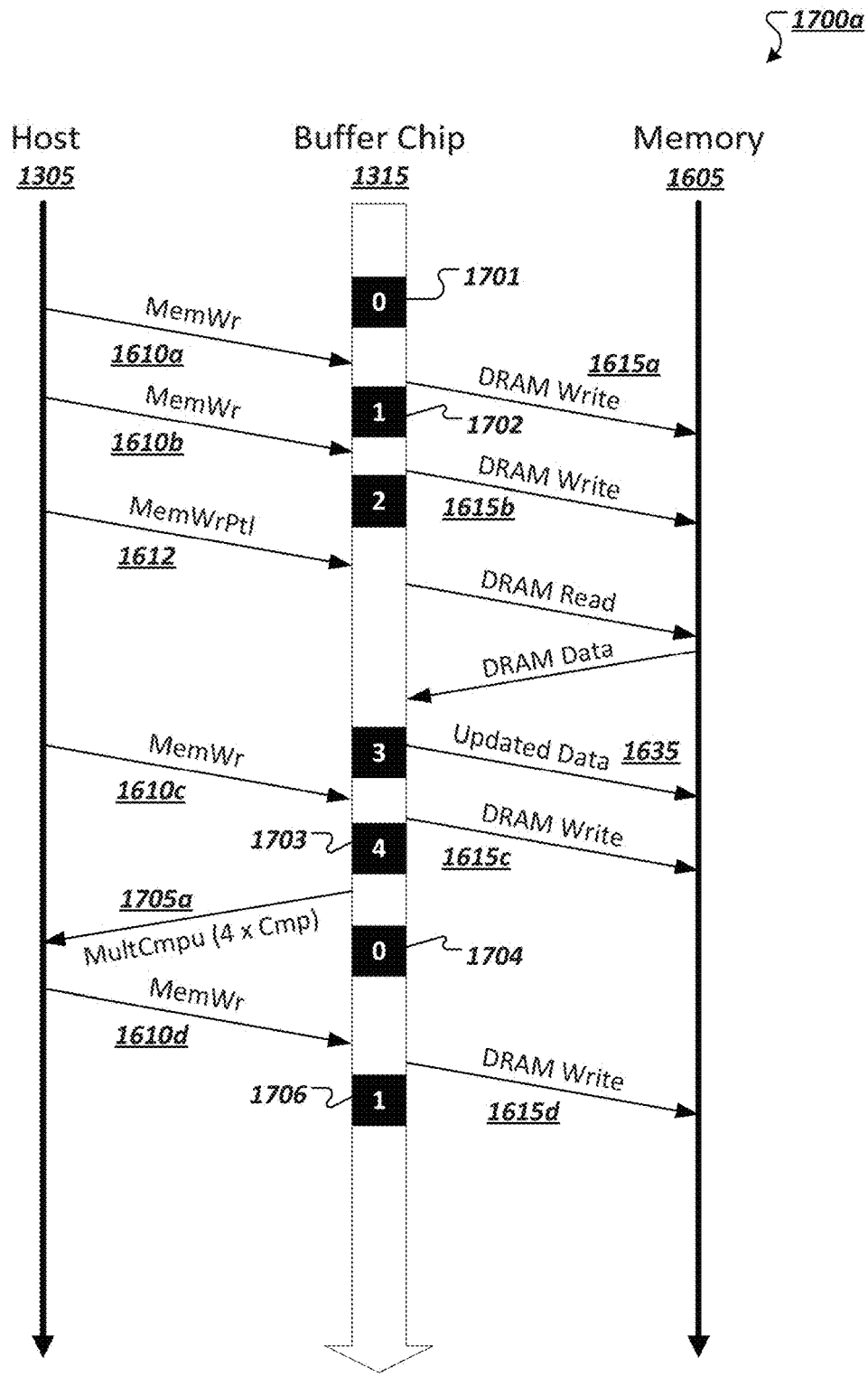
FIGS. 17A-17B are flow diagrams illustrating example packed write completions to multiple memory write requests.
Figure 17B:
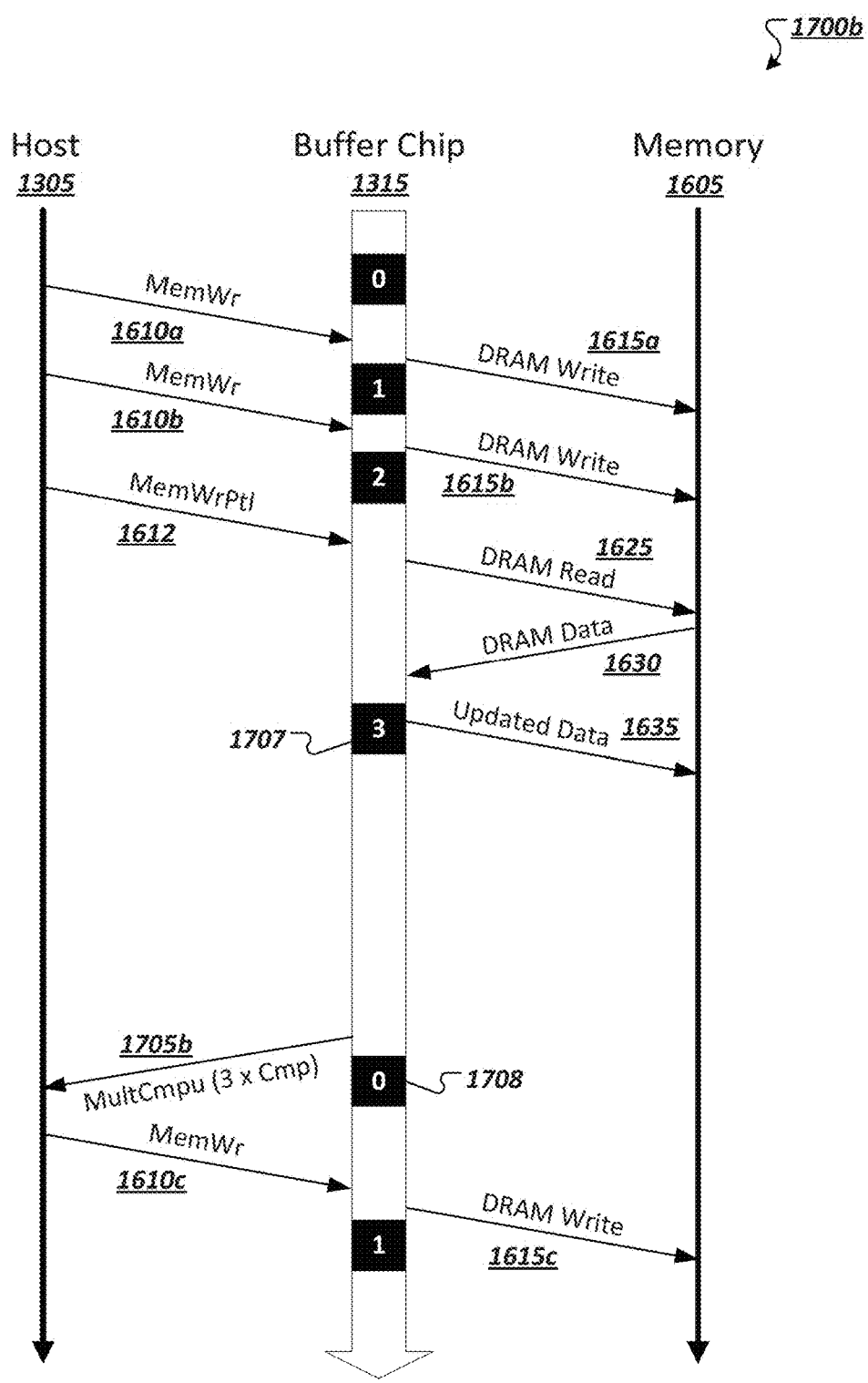

FIGS. 17A-17B are flow diagrams 1700a,b illustrating example, simplified transactions involving packed write completions, in accordance with principles of at least one embodiment. For instance, in the example of FIG. 17A, a buffer device can maintain a queue, buffer, or other resource to queue and count (e.g., at 1701) completions to various memory write commands from a particular host (e.g., 1305). For instance, at 1701, no write completions have been queued. A memory write (MemWr) 1610a can be sent from the host 1305 to the buffer device 1315 and a memory controller of the buffer device 1315 can accordingly cause the Write data to be written (at 1615a) to memory 1605. The buffer device 1315 can generate (or otherwise determine) a corresponding write completion to be sent for the memory write 1610a. The write completion can be indexed by a transaction identifier (TID) of the memory write operation 1610a (e.g., rather than the memory address written-to).

In this example, rather than returning the write completion to memory write command 1610a, the buffer device 1315 can begin developing a set of write completions to be sent together in a packed write completion packet. Accordingly, the buffer device 1315 can identify (e.g., at 1702) that one write completion is needed and waiting to be sent. The buffer device can wait to send the completion to memory write command 1610*a*, and in the meantime potentially return multiple read responses to the host 1305, as well as receive and process multiple memory write requests (as well as read requests and other commands). For instance, another MemWr request 1610*b* can be received, as well as a MemWrPtl 1612, followed by another MemWr 1610*c*, and the buffer device can write (e.g., at 1615*b*, 1635, 1615*c*) corresponding data to memory 1605. Three additional write completions can be determined to be sent in response and can be queued together with the write completion for the first memory write 1610*a* in this example series. Accordingly, (as shown at 1703) four write completions can be queued for sending.

In the particular illustrative examples of FIGS. 17A-17B, a buffer device 1315 can be configured to return up to four write completions at a time in a single packed write completion. The number of write completions to be encoded in a packed write completion can be based, for instance, on the size of the memory structure dedicated to queuing write completions at the buffer device. The number of write completions to be encoded in a single packed write completion can also, or alternatively, be based on the defined structure of packets and/or flits used in a memory link access protocol, as well as the size of the indexes used to map completions to requests. For instance, the available bits of a single flit can be maximized so as to pack as many write completions as possible into a single flit. In implementations where a flit is defined to support multiple slots, a portion of the slots may be defined to support packed write completions and the available bits in these slots can be maximized such that a maximum number of write completions are packed into the reserved slots, among other implementations. In this example, a buffer device 1315 is to generate and send a packed write completion packet (e.g., 1705*a*) in response to queuing four (4) write completions (at 1703). Accordingly, in response to completing writes for write requests 1610*a*, 1610*b*, 1612, and 1610*c*, four write completions are ready and are packed into packed write completion 1705, which is sent to the host 1305. The buffer device 1315 can then clear its queue (returning the completion queue to zero (at 1704)), and the process can continue with a fifth memory write 1610*d* resulting in another write completion being queued (at 1706) to correspond to the completed write 1615*d*.

In FIG. 17B, an alternate version of the example of FIG. 17A is represented. As with the example of FIG. 17A, memory write requests 1610*a*, 1610*b*, and 1612 are received and processed (at 1615*a*, 1615*b*, 1625, 1630, 1635). Further, following these three writes, the buffer device 1315 can queue (at 1707) three write completions to be sent in a packed write completion packet. However, in the example of FIG. 17B, the buffer device 1305 may not always wait to fill the four available spaces in a single packed write completion before sending the packed write completion. For instance, in some implementations, a buffer device 1305 can maintain a timer or transaction counter, such that the buffer device 1305 is to send a packed write completion (e.g., 1705*b*) on the earlier of the expiration of the timer or the filling of the write completion queue and/or packed write completion (i.e., processing the fourth write request). As an example, packed write completion flows in a memory buffer should have a timeout threshold that prevents any individual completion from waiting in the buffer too long (e.g., 100 flit times, or another value, such as one developed as a static or dynamic performance tuning threshold). Where a fully packed write completion packet is not required, a packed write completion 1705*b* is sent prior to collecting enough pending write completions to fill the packed write completion. Sending the partial packed write completion 1705*b* can nonetheless empty the pending write completion queue (as shown at 1708), with the next memory write representing the first write completion to re-fill the queue. In other implementations, the filling of the packed write completion packet may be a requirement prior to its being allowed to be sent (e.g., to maximize bandwidth), among other alternative implementations.

Figure 18:
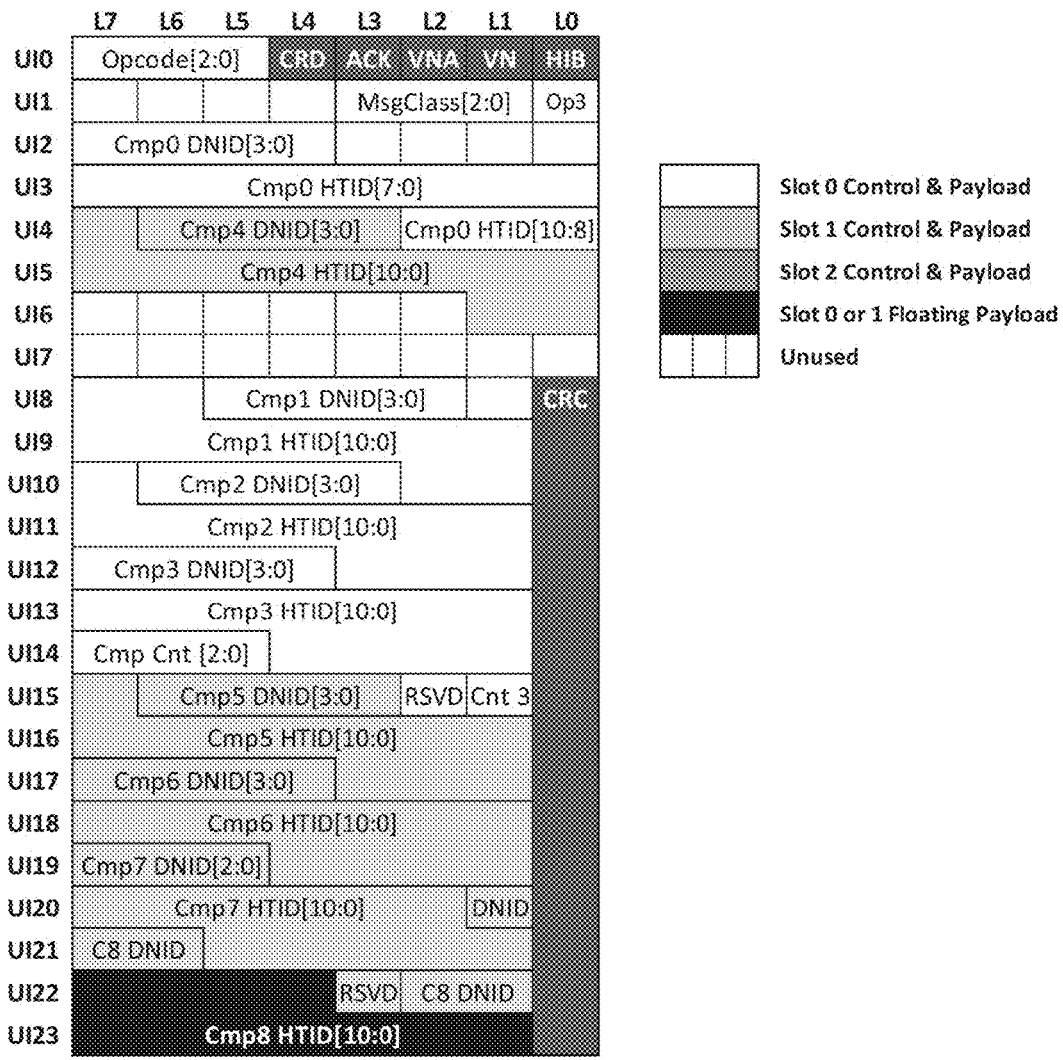
FIG. 18 illustrates a representation of an example packed write completion packet.

In one example implementation, a protocol can define a 192-bit, 3 slot flit having a 16-bit CRC field, such as a flit formatted according to principles of the example of FIG. 10 or FIGS. 15A-15C above. A packed write completion packet format can be defined to assume the entire 192 flit. The packet can be of a type that is to occupy a single flit and is to comprise a response with no data (such as a completion). FIG. 18 illustrates one such implementation of a packed write completion packet 1800. The flit can include an opcode field and message class field which can be combined to form the opcode of the flit and indicate the general format of the flit and further indicate that the flit is a packed write completion packet. In the example of FIG. 18, two of three available flit slots (e.g., Slots 0 and 1) are used while the third (and smallest Slot 2), is left unused. Alternative implementations may utilize all three slots, among other changes to the format shown in FIG. 18.

In the particular example of FIG. 18, up to nine completions can be sent on a single 192-bit flit. Fewer completions can be allowed to be sent. A four-bit completion count field (e.g., "Cnt 3" and "Cmp Cnt [2:0]" combining to form bits 3:0 of the field) can be encoded to indicate how many completions are valid and included in the flit 1800. A host can decode this value to interpret how many completions to extract from the packed write completion packet 1800. Each completion in the flit 1800 can include a respective eleven (11) bit index field ("HTID") in which the TID of the completion's corresponding write command is to be encoded together with a four (4) bit destination node identifier ("DNID") field for use in encoding directory state information (e.g., when the completion is in response to an invalidate command). As an example, the four bit DNID field could be encoded with a 2-bit node identifier value and 2-bit directory state value, among other example encoding schemes.

In some instances, a packed write completion (MultCmpU) may result in potential additional acknowledgement (ACK)/credit (CRD) accumulation since fewer Header flits would be injected at full load. This can be accounted for in buffer sizing (to support such accumulation) as well as by providing for the increased injection of credit return flits (or even providing for credit return fields in alternative implementations of the packed write completion flit), among other examples. In some implementations, similar to that mentioned in the last bullet).

While FIG. 18 shows one illustrative example of a packed write completion flit format, other implementations may adopt other fields and organizations of the flit space. For instance, two alternative packed write completion flit formats can be defined (corresponding to two different write completion buffers at the buffer device), one for invalidate completions that include the additional overhead of directory information encoding, and the second for other memory write completions that only include the index value of the completion. It should be appreciated that other example flit sizes, flit formats, packed write completion formats, etc. may utilize principles described herein to realize packed write completions without departing from the scope of this disclosure.

Figure 19:
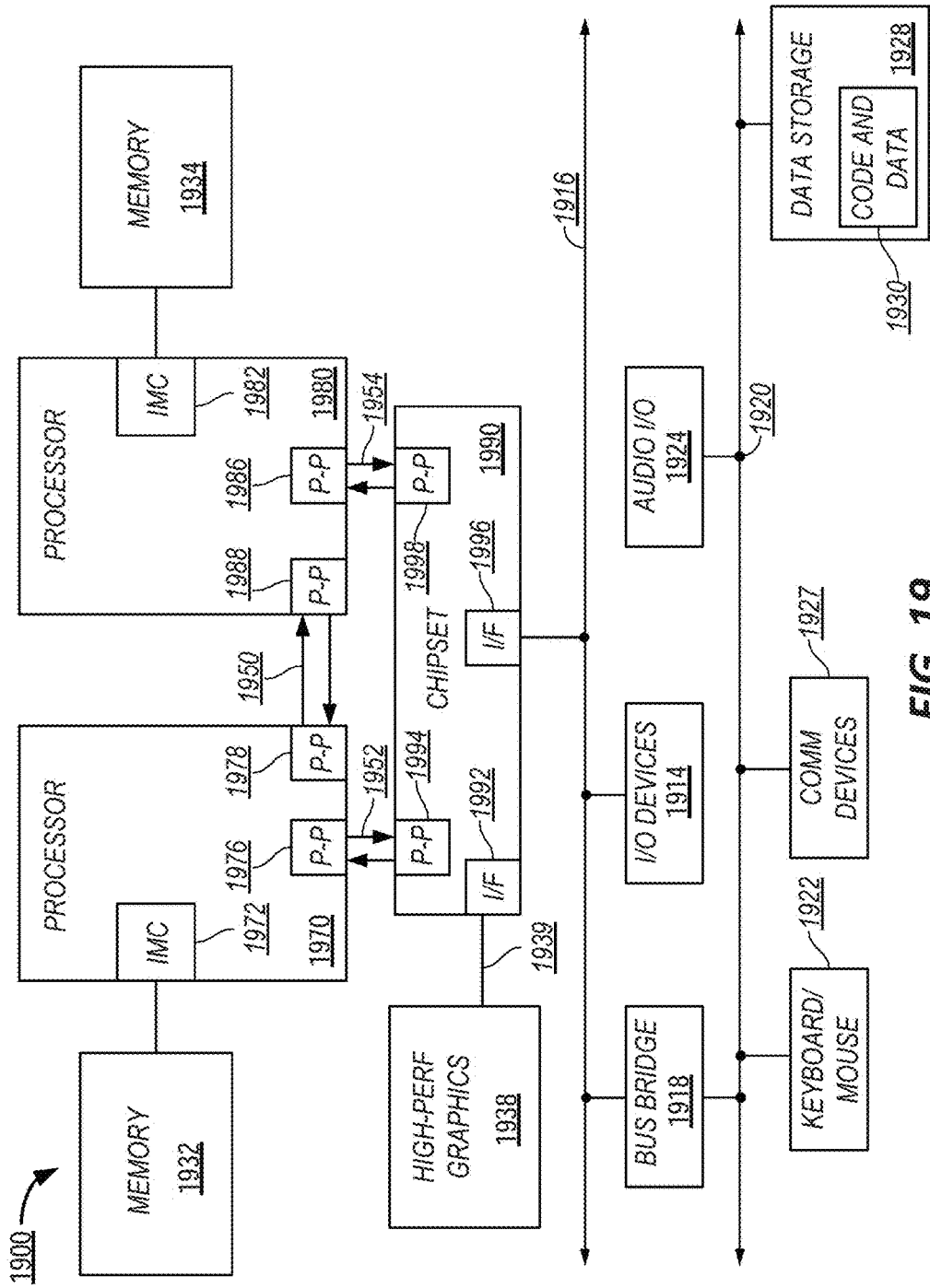
FIG. 19 illustrates an embodiment of a block for a computing system including multiple processor sockets.

HPI and an associated buffered memory access protocol can be incorporated in any variety of computing devices and systems, including mainframes, server systems, personal computers, mobile computers (such as tablets, smartphones, personal digital systems, etc.), smart appliances, gaming or entertainment consoles and set top boxes, among other examples. For instance, referring to FIG. 19, shown is a block diagram of a second system 1900 in accordance with an embodiment of the present invention. As shown in FIG. 19, multiprocessor system 1900 is a point-to-point interconnect system, and includes a first processor 1970 and a second processor 1980 coupled via a point-to-point interconnect 1950. Each of processors 1970 and 1980 may be some version of a processor. In one embodiment, 1952 and 1954 are part of a serial, point-to-point coherent interconnect fabric, such as a high-performance architecture. As a result, the invention may be implemented within the QPI architecture.

While shown with only two processors 1970, 1980, it is to be understood that the scope of the present invention is not so limited. In other embodiments, one or more additional processors may be present in a given processor. Processors 1970 and 1980 are shown including integrated memory controller units 1972 and 1982, respectively. Processor 1970 also includes as part of its bus controller units point-to-point (P-P) interfaces 1976 and 1978; similarly, second processor 1980 includes P-P interfaces 1986 and 1988. Processors 1970, 1980 may exchange information via a point-to-point (P-P) interface 1950 using P-P interface circuits 1978, 1988. As shown in FIG. 19, IMCs 1972 and 1982 couple the processors to respective memories, namely a memory 1932 and a memory 1934, which may be portions of main memory locally attached to the respective processors.

Processors 1970, 1980 each exchange information with a chipset 1990 via individual P-P interfaces 1952, 1954 using point to point interface circuits 1976, 1994, 1986, 1998. Chipset 1990 also exchanges information with a high-performance graphics circuit 1938 via an interface circuit 1992 along a high-performance graphics interconnect 1939.

A shared cache (not shown) may be included in either processor or outside of both processors; yet connected with the processors via P-P interconnect, such that either or both processors' local cache information may be stored in the shared cache if a processor is placed into a low power mode.

Chipset 1990 may be coupled to a first bus 1916 via an interface 1996. In one embodiment, first bus 1916 may be a Peripheral Component Interconnect (PCI) bus, or a bus such as a PCI Express bus or another third generation I/O interconnect bus, although the scope of the present invention is not so limited.

As shown in FIG. 19, various I/O devices 1914 are coupled to first bus 1916, along with a bus bridge 1918 which couples first bus 1916 to a second bus 1920. In one embodiment, second bus 1920 includes a low pin count (LPC) bus. Various devices are coupled to second bus 1920 including, for example, a keyboard and/or mouse 1922, communication devices 1927 and a storage unit 1928 such as a disk drive or other mass storage device which often includes instructions/code and data 1930, in one embodiment. Further, an audio I/O 1924 is shown coupled to second bus 1920. Note that other architectures are possible, where the included components and interconnect architectures vary. For example, instead of the point-to-point architecture of FIG. 19, a system may implement a multi-drop bus or other such architecture.

Figure 20:
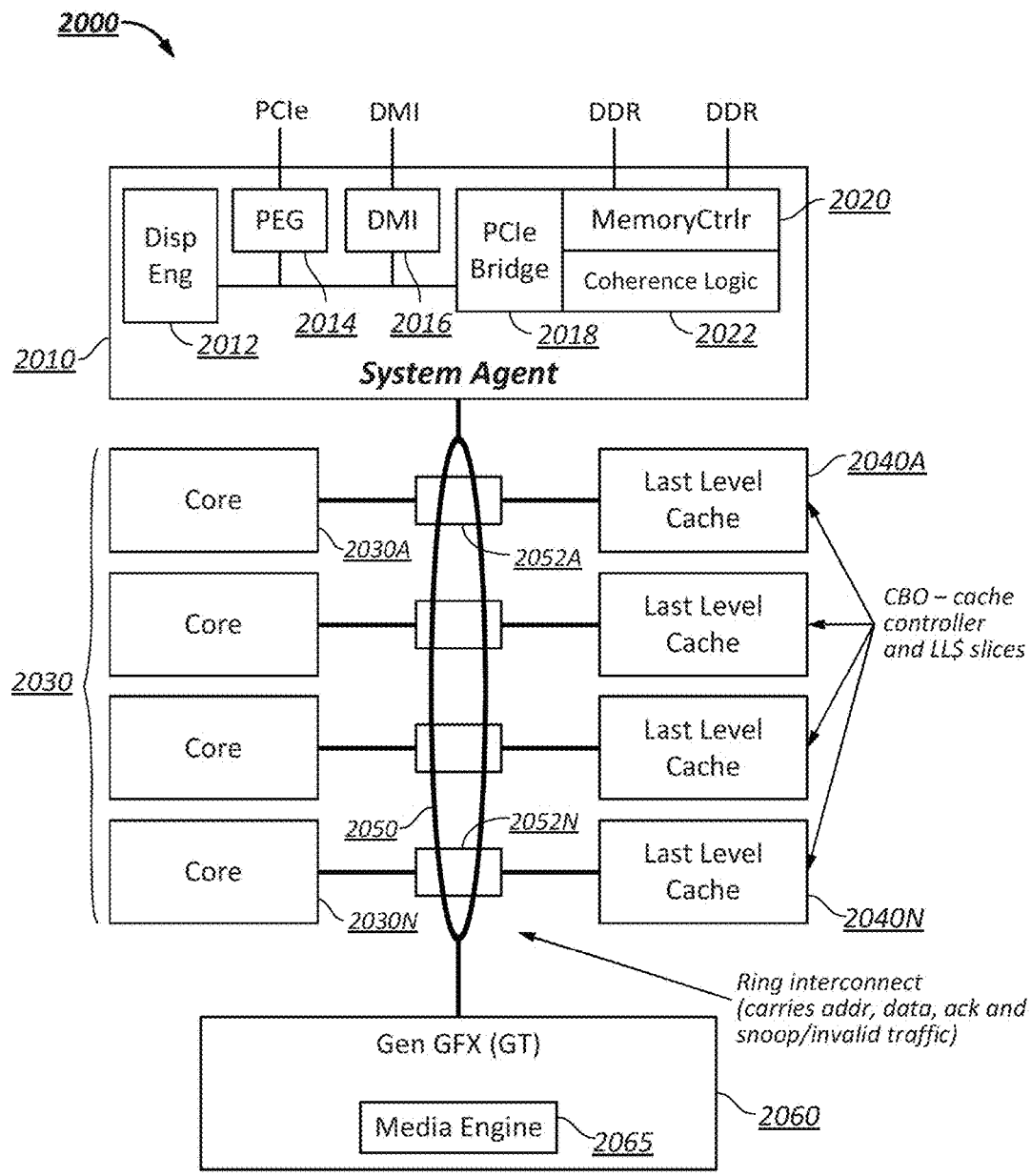
FIG. 20 illustrates another embodiment of a block diagram for a computing system including a multicore processor.

Referring now to FIG. 20, shown is a block diagram of an embodiment of a multicore processor. As shown in the embodiment of FIG. 20, processor 2000 includes multiple domains. Specifically, a core domain 2030 includes a plurality of cores 2030A-2030N, a graphics domain 2060 includes one or more graphics engines having a media engine 2065, and a system agent domain 2010.

In various embodiments, system agent domain 2010 handles power control events and power management, such that individual units of domains 2030 and 2060 (e.g. cores and/or graphics engines) are independently controllable to dynamically operate at an appropriate power mode/level (e.g. active, turbo, sleep, hibernate, deep sleep, or other Advanced Configuration Power Interface like state) in light of the activity (or inactivity) occurring in the given unit. Each of domains 2030 and 2060 may operate at different voltage and/or power, and furthermore the individual units within the domains each potentially operate at an independent frequency and voltage. Note that while only shown with three domains, understand the scope of the present invention is not limited in this regard and additional domains may be present in other embodiments.

As shown, each core 2030 further includes low level caches in addition to various execution units and additional processing elements. Here, the various cores are coupled to each other and to a shared cache memory that is formed of a plurality of units or slices of a last level cache (LLC) 2040A-2040N; these LLCs often include storage and cache controller functionality and are shared amongst the cores, as well as potentially among the graphics engine too.

As seen, a ring interconnect 2050 couples the cores together, and provides interconnection between the core domain 2030, graphics domain 2060 and system agent circuitry 2010, via a plurality of ring stops 2052A-2052N, each at a coupling between a core and LLC slice. As seen in FIG. 20, interconnect 2050 is used to carry various information, including address information, data information, acknowledgement information, and snoop/invalid information. Although a ring interconnect is illustrated, any known on-die interconnect or fabric may be utilized. As an illustrative example, some of the fabrics discussed above (e.g. another on-die interconnect, On-chip System Fabric (OSF), an Advanced Microcontroller Bus Architecture (AMBA) interconnect, a multi-dimensional mesh fabric, or other known interconnect architecture) may be utilized in a similar fashion.

As further depicted, system agent domain 2010 includes display engine 2012 which is to provide control of and an interface to an associated display. System agent domain 2010 may include other units, such as: an integrated memory controller 2020 that provides for an interface to a system memory (e.g., a DRAM implemented with multiple DIMMs; coherence logic 2022 to perform memory coherence operations. Multiple interfaces may be present to enable interconnection between the processor and other circuitry. For example, in one embodiment at least one direct media interface (DMI) 2016 interface is provided as well as one or more PCIe™ interfaces 2014. The display engine and these interfaces typically couple to memory via a PCIe™ bridge 2018. Still further, to provide for communications between other agents, such as additional processors or other circuitry, one or more other interfaces may be provided.

While the present invention has been described with respect to a limited number of embodiments, those skilled in the art will appreciate numerous modifications and variations therefrom. It is intended that the appended claims cover all such modifications and variations as fall within the true spirit and scope of this present invention.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the invention may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

The following examples pertain to embodiments in accordance with this Specification. The following examples pertain to embodiments in accordance with this Specification. One or more embodiments may provide an apparatus, a system, a machine readable storage, a machine readable medium, hardware- and/or software-based logic (e.g., memory buffer logic), and method to identify a plurality of completed writes to memory corresponding to a plurality of write requests from a host device received over a buffered memory interface, and send a completion packet to the host device that includes a plurality of write completions to correspond to the plurality of completed writes.

In at least one example, the memory buffer logic is further to receive the plurality of write requests and cause corresponding data to be written to memory.

In at least one example, the plurality of write requests are to be received from the host device over a buffered memory interface.

In at least one example, each of the plurality of write requests has a corresponding transaction identifier and each of the write completions to be included in the completion packet is indicate a corresponding one of the transaction identifiers.

In at least one example, at least a particular one of the write completions is to correspond to an invalidation request, the invalidation request is to update a directory state, and the particular write completion is to indicate directory information corresponding to the invalidation request.

In at least one example, the completion packet is to include a completion count field to indicate an amount of completions corresponding to the plurality of write completions.

In at least one example, the amount of completions is constrained by a maximum number of completions that can be packed in the completion packet.

In at least one example, the maximum number of completions is at least nine.

In at least one example, the plurality of write completions includes less than the maximum number and the completion packet is to be sent with less than the maximum number of write completions.

In at least one example, the completion packet includes a single flit.

In at least one example, the single flit is defined according to a protocol to support three slots in the flit.

In at least one example, at least two of the slots are used for encoding of the plurality of write completions.

In at least one example, the memory buffer logic is to include a memory controller.

In at least one example, at least a first one the plurality of write requests is a first type of write request and at least a second one of the plurality of write requests is a second type of write requests.

In at least one example, the first and second types of write requests are included in a plurality of write request types, and the plurality of write request types include normal memory write requests, memory write partial requests, memory write flush flow requests, and invalidate requests.

One or more embodiments may provide buffer chip that includes a memory controller to access data in memory responsive to a plurality of write requests received from a separate host device, complete writes to memory associated with the plurality of write requests, generate a completion packet to include a plurality of write completions for the completed writes to memory, and send the completion packet to the host device.

In at least one example, a queue is provided to queue the write completions prior to generating the completion packet.

One or more embodiments may provide a system including a buffer chip, memory to be accessed through the buffer chip, a processor block coupled to the buffer chip by a memory access link. The buffer chip can include logic to identify a plurality of completed writes to memory corresponding to a plurality of write requests from the processor block received over the memory access link, and send a completion packet to the processor block over the memory access link, where the completion packet is to include a plurality of write completions to correspond to the plurality of completed writes.

In at least one example, the processor block is to interface with one or more other devices over a general purpose input/output (GPIO) interconnect link, where the memory access link is different from the GPIO interconnect link, and a physical layer of memory access link is based on a physical layer of the GPIO interconnect link.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the invention as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
   memory buffer logic to:
   identify a plurality of completed writes to memory, wherein the plurality of completed writes are to correspond to a plurality of write requests from a host device received over a buffered memory interface, and each of the plurality of write requests has a corresponding transaction identifier; and
   send a completion to the host device, wherein the completion is to comprise a plurality of completion fields, at least a subset of the plurality of completion fields are to be encoded with a respective one of a plurality of write completions to correspond to the plurality of completed writes, the completion is to further comprise a completion count field to indicate an amount of completions corresponding to the plurality of write completions, the completion is to be further encoded with the transaction identifiers corresponding to each of the plurality of write completions, the completion comprises a single link layer flow control unit (flit), and the flit comprises a multi-slot flit;
   wherein the multi-slot flit comprises at least three slots, two or more of the plurality of completion fields are to be included in a first one of the at least three slots, two or more of the plurality of completion fields are to be included in a second one of the at least three slots, and at least one of the at least three slots is to be left unused.

2. The apparatus of claim 1, wherein the memory buffer logic is further to receive the plurality of write requests and cause corresponding data to be written to memory.

3. The apparatus of claim 2, wherein the plurality of write requests are to be received from the host device over a buffered memory interface.

4. The apparatus of claim 1, wherein at least a particular one of the write completions is to correspond to an invalidation request, the invalidation request is to update a directory state, and the particular write completion is to indicate directory information corresponding to the invalidation request.

5. The apparatus of claim 1, wherein the amount of completions is constrained by a maximum number of completions that can be packed in the completion.

6. The apparatus of claim 5, wherein the maximum number of completions is at least nine.

7. The apparatus of claim 5, wherein the plurality of write completions comprises less than the maximum number and the completion is to be sent with less than the maximum number of write completions.

8. The apparatus of claim 1, wherein the memory buffer logic is to comprise a memory controller.

9. The apparatus of claim 1, wherein at least a first one the plurality of write requests is a first type of write request and at least a second one of the plurality of write requests is a second type of write requests.

10. The apparatus of claim 9, wherein the first and second types of write requests are included in a plurality of write request types, and the plurality of write request types comprise normal memory write requests, memory write partial requests, memory write flush flow requests, and invalidate requests.

11. A buffer chip comprising:
    a memory controller to:
    access data in memory responsive to requests received from a separate host device, wherein the requests are to comprise a plurality of write requests, and each of the plurality of write requests has a corresponding transaction identifier;
    complete writes to memory associated with the plurality of write requests;
    generate a completion to comprise a plurality of completion fields, at least a subset of the plurality of completion fields are to be encoded with a respective one of a plurality of write completions for the completed writes to memory, wherein the completion is to further comprise a completion count field to indicate an amount of completions corresponding to the plurality of write completions, the completion is to be further encoded with the transaction identifiers corresponding to each of the plurality of write, the completion comprises a single link layer flow control unit (flit), and the flit comprises a multi-slot flit; and
    send the completion to the host device;
    wherein the multi-slot flit comprises at least three slots, two or more of the plurality of completion fields are to be included in a first one of the at least three slots, two or more of the plurality of completion fields are to be included in a second one of the at least three slots, and at least one of the at least three slots is to be left unused.

12. The buffer chip of claim 11, further comprising a queue to queue the write completions prior to generating the completion.

13. At least one non-transitory machine accessible storage medium having code stored thereon, the code when executed on a machine, causes the machine to:
    identify a plurality of completed writes to memory, wherein the plurality of completed writes are to correspond to a plurality of write requests from a host device received over a buffered memory interface, and each of the plurality of write requests has a corresponding transaction identifier; and
    send a completion to the host device, wherein the completion is to comprise a plurality of completion fields, at least a subset of the plurality of completion fields are to be encoded with a respective one of a plurality of write completions to correspond to the plurality of completed writes, the completion is to further comprise a completion count field to indicate an amount of completions corresponding to the plurality of write completions, the completion is to be further encoded with the transaction identifiers corresponding to each of the plurality of write completions, the completion comprises a single link layer flow control unit (flit), and the flit comprises a multi-slot flit;

wherein the multi-slot flit comprises at least three slots, two or more of the plurality of completion fields are to be included in a first one of the at least three slots, two or more of the plurality of completion fields are to be included in a second one of the at least three slots, and at least one of the at least three slots is to be left unused.

14. A system comprising:
a buffer chip;
memory to be accessed through the buffer chip; and
a processor block coupled to the buffer chip by a memory access link,
wherein the buffer chip comprises logic to:
  identify a plurality of completed writes to memory, wherein the plurality of completed writes are to correspond to a plurality of write requests from the processor block received over the memory access link, and each of the plurality of write requests has a corresponding transaction identifier; and
  send a completion to the processor block over the memory access link, wherein the completion is to comprise a plurality of completion fields, at least a subset of the plurality of completion fields are to be encoded with a respective one of a plurality of write completions to correspond to the plurality of completed writes, the completion is to further comprise a completion count field to indicate an amount of completions corresponding to the plurality of write completions, the completion is to be further encoded with the transaction identifiers corresponding to each of the plurality of write completions, the completion comprises a single link layer flow control unit (flit), and the flit comprises a multi-slot flit;
wherein the multi-slot flit comprises at least three slots, two or more of the plurality of completion fields are to be included in a first one of the at least three slots, two or more of the plurality of completion fields are to be included in a second one of the at least three slots, and at least one of the at least three slots Is to be left unused.

15. The system of claim 14, wherein the processor block is to interface with one or more other devices over a general purpose input/output (GPIO) interconnect link, wherein the memory access link is different from the GPIO interconnect link, and a physical layer of memory access link is based on a physical layer of the GPIO interconnect link.

* * * * *